United States Patent
Cho et al.

(10) Patent No.: US 9,768,106 B2
(45) Date of Patent: Sep. 19, 2017

(54) CHIP-ON-FILM PACKAGE AND DISPLAY DEVICE INCLUDING THE SAME

(71) Applicant: Samsung Electronics Co., Ltd., Suwon-si, Gyeonggi-do (KR)

(72) Inventors: Young-Jin Cho, Hwaseong-si (KR); Jong-Min Jung, Incheon (KR); Yun-Ji Hur, Hwaseong-si (KR); Sung-Sik Park, Seoul (KR); Keun-Bong Lee, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/993,044

(22) Filed: Jan. 11, 2016

(65) Prior Publication Data

US 2016/0218053 A1 Jul. 28, 2016

(30) Foreign Application Priority Data

Jan. 26, 2015 (KR) .................. 10-2015-0011891

(51) Int. Cl.
*H01L 23/495* (2006.01)
*H01L 23/498* (2006.01)
(Continued)

(52) U.S. Cl.
CPC ...... *H01L 23/4985* (2013.01); *G02F 1/13452* (2013.01); *H01L 23/49838* (2013.01);
(Continued)

(58) Field of Classification Search
USPC ......... 257/252–254, 257–258, 13.4, 79–103, 257/918, 668; 438/22, 24, 48, 126;
(Continued)

(56) References Cited

U.S. PATENT DOCUMENTS 5,847,936 A * 12/1998 Forehand ............... H05K 1/114
174/250
2001/0015785 A1 * 8/2001 Bjorkengren ....... G02F 1/13452
349/149
(Continued)

FOREIGN PATENT DOCUMENTS

JP 2004193223 A 7/2004
JP 2013172099 A 9/2013
(Continued)

*Primary Examiner* — Tram H Nguyen
(74) *Attorney, Agent, or Firm* — Renaissance IP Law Group LLP

(57) ABSTRACT

A chip-on-film (COF) package includes a base film, a semiconductor chip mounted on a chip mounting region of a top surface of the base film, a plurality of top inner output conductive patterns, a plurality of bottom inner output conductive patterns and a plurality of landing vias. The top inner output conductive patterns are formed on the top surface of the base film and respectively connected to chip inner output pads formed on a bottom surface of the semiconductor chip. The bottom inner output conductive patterns are formed on a bottom surface of the base film. The landing vias are formed to vertically penetrate the base film and to respectively connect the top inner output conductive patterns and the bottom inner output conductive patterns. The landing vias are arranged within the chip mounting region to form a two-dimensional shape.

20 Claims, 19 Drawing Sheets

(51) Int. Cl.
*H01L 23/00* (2006.01)
*G02F 1/1345* (2006.01)
*H01L 23/14* (2006.01)

(52) U.S. Cl.
CPC ............ *H01L 24/00* (2013.01); *H01L 23/145* (2013.01); *H01L 23/49894* (2013.01); *H01L 2224/16225* (2013.01); *H01L 2224/32225* (2013.01); *H01L 2224/73204* (2013.01); *H01L 2924/0002* (2013.01)

(58) Field of Classification Search
USPC ........................................................ 345/419
See application file for complete search history.

(56) References Cited

U.S. PATENT DOCUMENTS

| 2004/0108594 | A1 | 6/2004 | Toyosawa |
| 2007/0138654 | A1 | 6/2007 | Kim |
| 2009/0079047 | A1 | 3/2009 | Nakayama |
| 2011/0075390 | A1 | 3/2011 | Choi et al. |
| 2012/0299197 | A1* | 11/2012 | Kwon ............... H01L 23/49816 257/777 |
| 2014/0054793 | A1 | 2/2014 | Ha et al. |

FOREIGN PATENT DOCUMENTS

| KR | 20070064896 A | 6/2007 |
| KR | 20070071005 A | 7/2007 |
| KR | 20100081624 A | 7/2010 |
| KR | 20110033328 A | 3/2011 |
| KR | 20120129652 A | 11/2012 |

* cited by examiner

FIG. 1
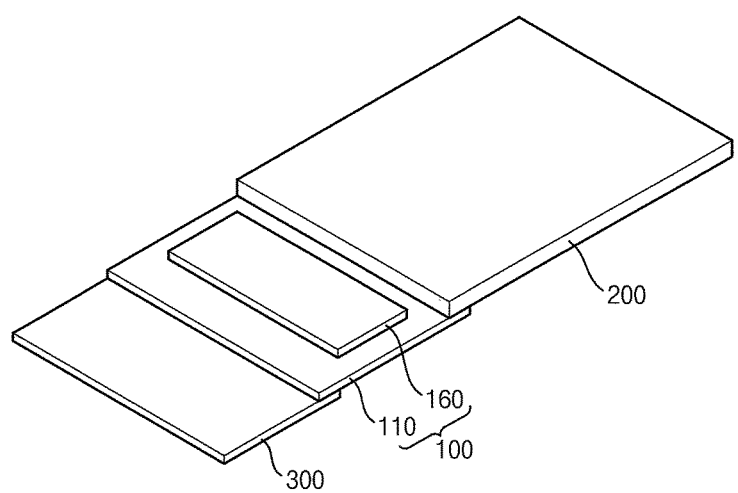
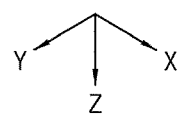

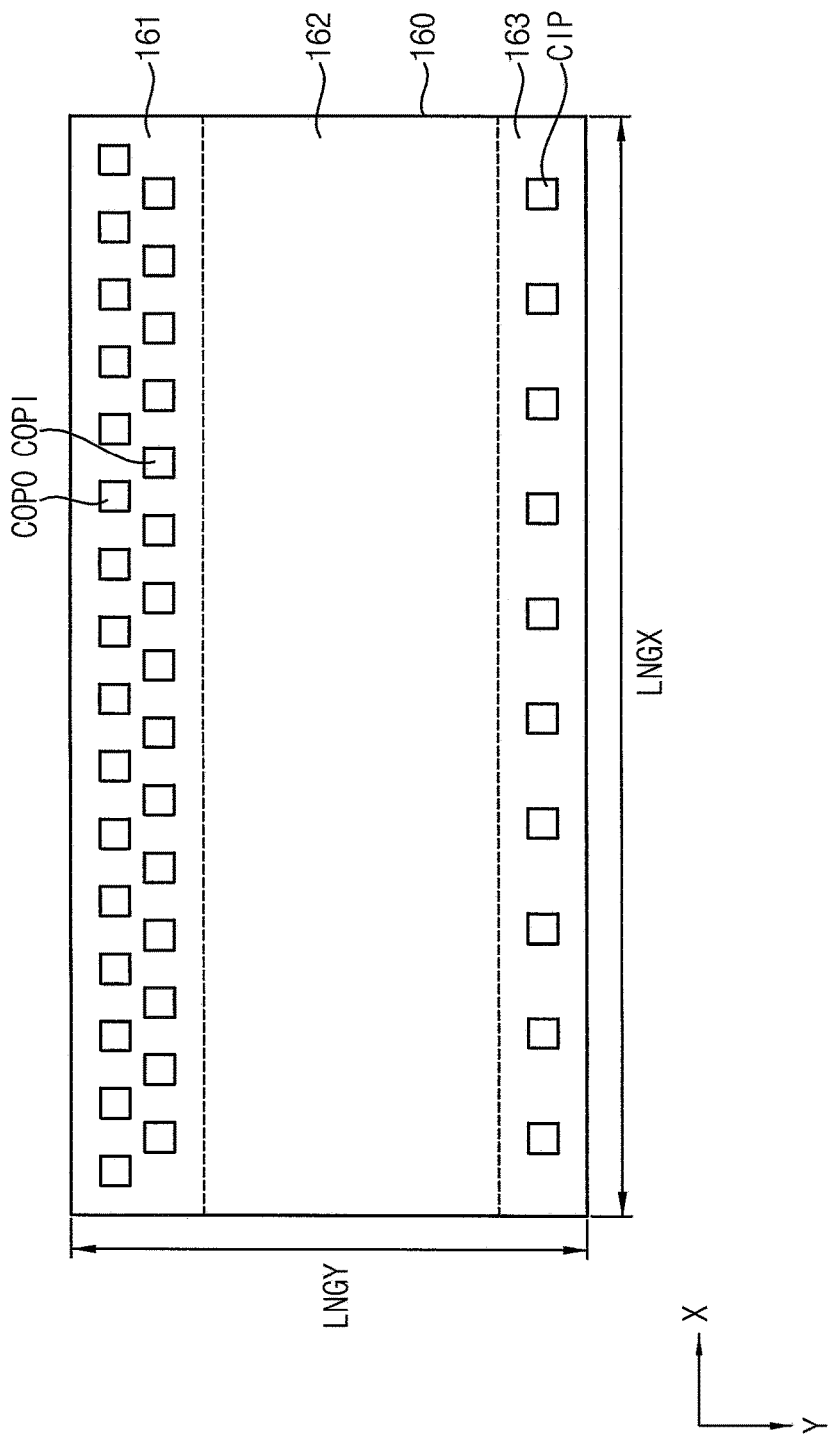

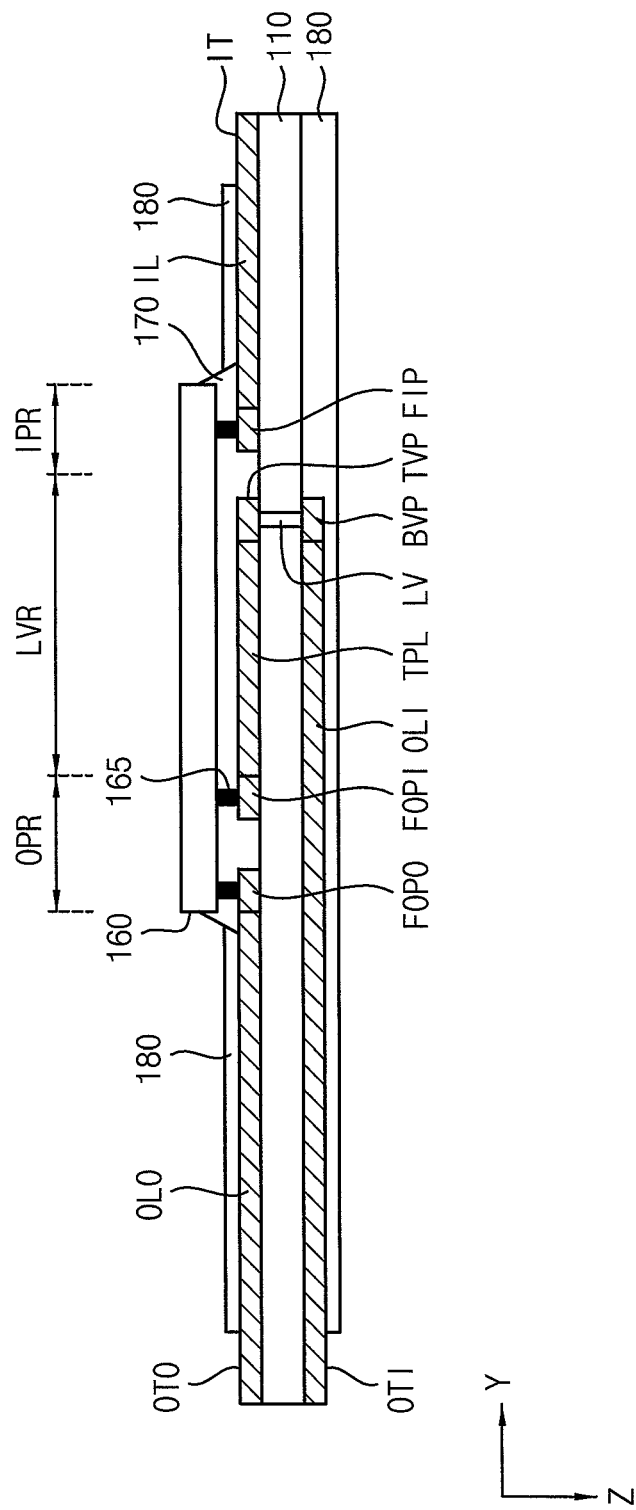

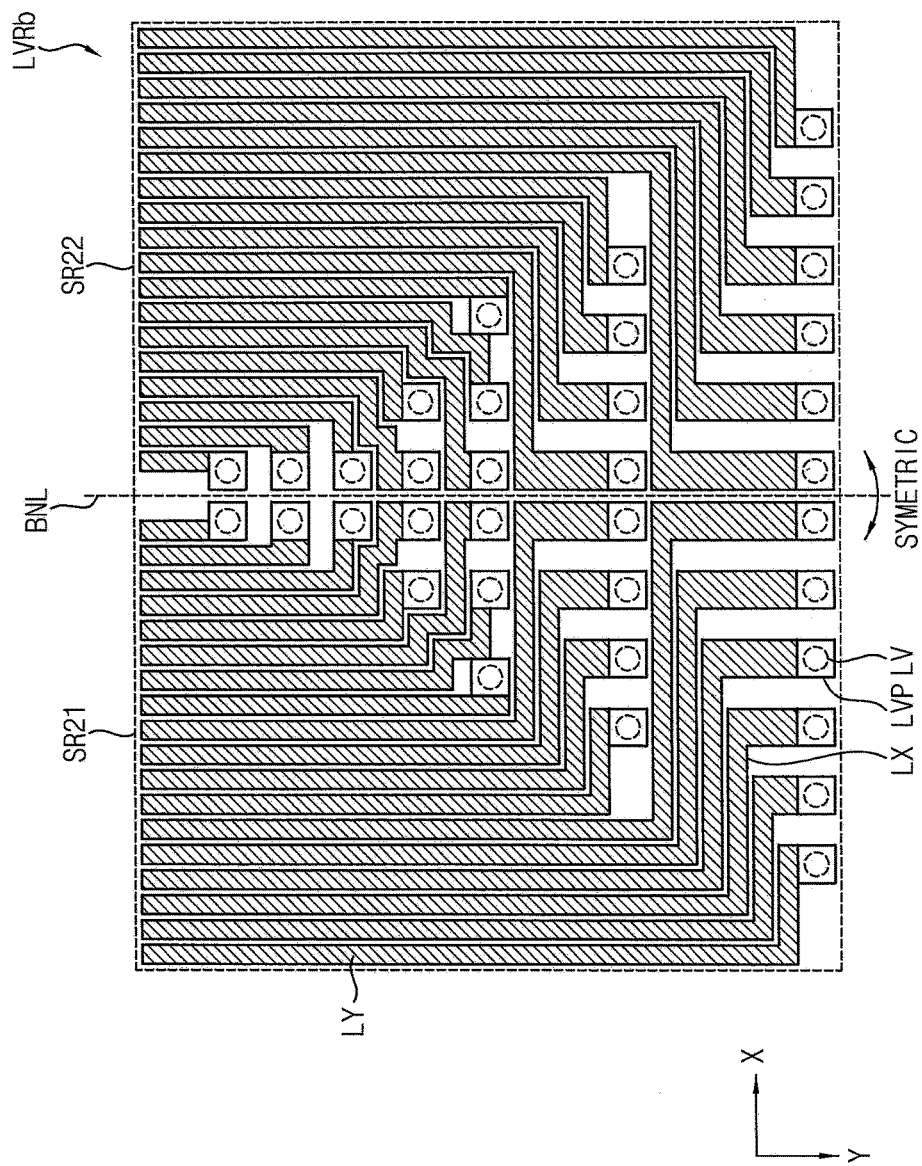

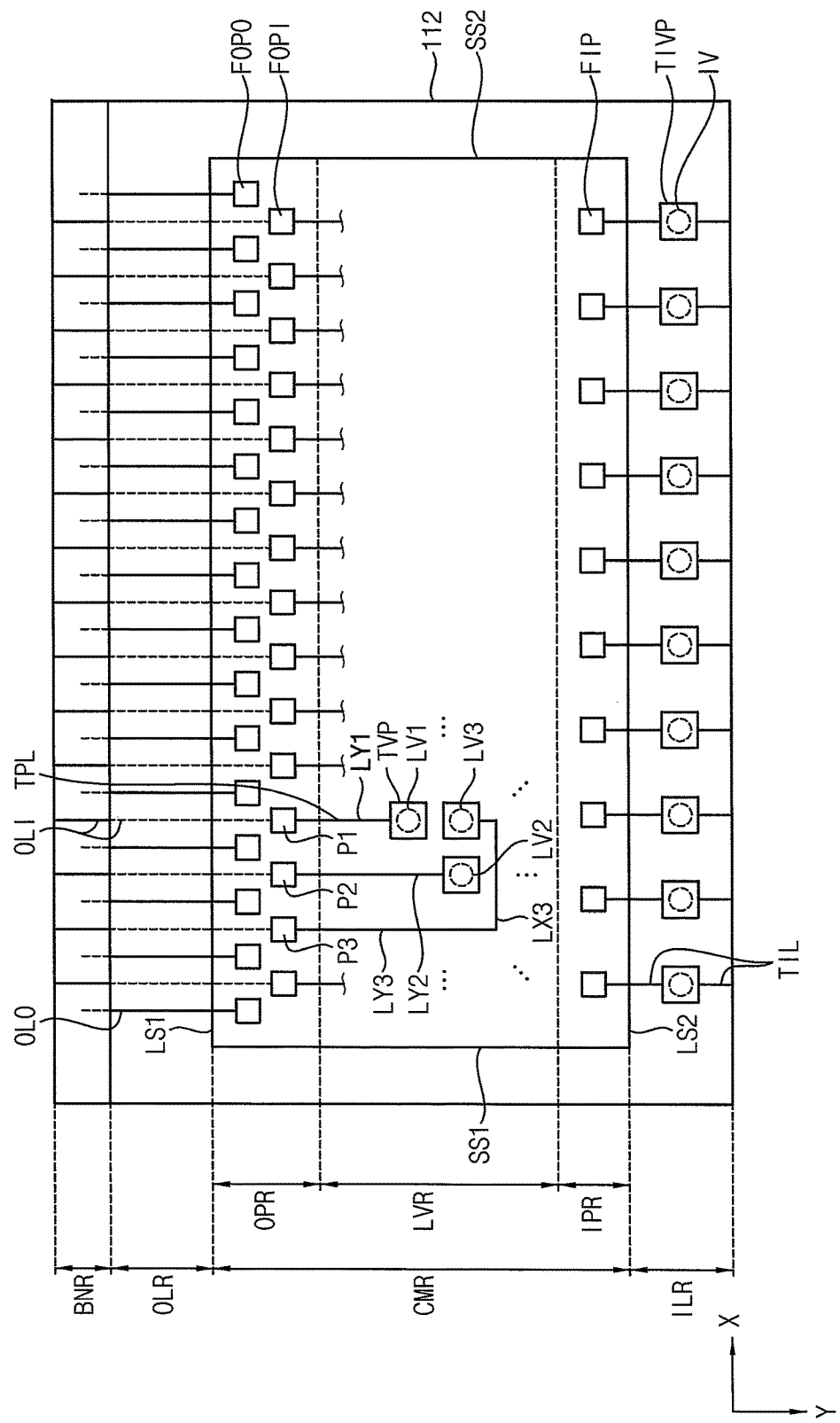

CHIP-ON-FILM PACKAGE AND DISPLAY DEVICE INCLUDING THE SAME

CROSS-REFERENCE TO RELATED APPLICATION

This U.S. Non-provisional application claims priority under 35 USC §119 to Korean Patent Application No. 10-2015-0011891, filed on Jan. 26, 2015, in the Korean Intellectual Property Office (KIPO), the disclosure of which is incorporated by reference in its entirety herein.

BACKGROUND

1. Technical Field

Example embodiments relate generally to semiconductor devices, and more particularly to a chip-on-film package and a display device including a chip-on-film package.

2. Discussion of the Related Art

A display driver integrated circuit (DDIC) chip may be connected to a display panel using a tape carrier package (TCP), a chip-on-film (COF) package, a chip-on-glass (COG) package, etc. According to demands on flexibility of electronic products such as a mobile display, various techniques for the COF package using a flexible base film have been proposed. In comparison with the COG structure, the bump pitch and the metal wire width are wider and thus the layout design accompanies many restrictions in the COF structure. The size of the DDIC chip has been reduced significantly along with the development of the manufacturing process but there is a problem that the structural limits of the COF package restricts the size of the DDIC chip.

SUMMARY

Some example embodiments of the inventive concept provide a COF package having a reduced size.

Some example embodiments of the inventive concept provide a display device including a COF package having a reduced size.

According to example embodiments, a chip-on-film (COF) package includes a base film, a semiconductor chip mounted on a chip mounting region of a top surface of the base film, a plurality of top inner output conductive patterns, a plurality of bottom inner output conductive patterns and a plurality of landing vias. The top inner output conductive patterns are formed on the top surface of the base film and respectively connected to chip inner output pads formed on a bottom surface of the semiconductor chip. The bottom inner output conductive patterns are formed on a bottom surface of the base film. The landing vias are formed to vertically penetrate the base film and to respectively connect the top inner output conductive patterns and the bottom inner output conductive patterns. The landing vias are arranged within the chip mounting region to form a two-dimensional shape.

In an example embodiment, the landing vias may be arranged to form at least one triangular shape.

In another embodiment, the chip mounting region may have a rectangular shape with first and second long sides along a first direction and first and second short sides along a second direction perpendicular to the first direction. The chip mounting region may include an output pad region adjacent to the first long side, an input pad region adjacent to the second long side and a landing via region between the output pad region and the input pad region.

In another embodiment, the landing via region may include a plurality of sub-regions arranged along the first direction, and the sub-regions may have a same arrangement of the landing vias.

In another embodiment, the landing via region may include a plurality of sub-regions arranged along the first direction, and two adjacent sub-regions may have a symmetric arrangement of the landing vias with respect to a boundary line of the two adjacent sub-regions.

In another embodiment, the top inner output conductive patterns may include a plurality of inner output pads arranged along the first direction within the output pad region, a plurality of top landing via pads arranged on the landing vias within the landing via region and a plurality of inner connection lines respectively connecting the inner output pads and the top landing via pads.

In another embodiment, at least two landing vias connected to at least two adjacent inner output pads may be adjacent and arranged along the first direction.

In another embodiment, at least one inner connection line among the inner connection lines connected to the at least two landing vias may include a first line and a second line. The first line may be connected to the corresponding top landing via pad and extended along the first direction. The second line may connect the first line and the corresponding inner output pad and extended along the second direction.

In another embodiment, the bottom inner output conductive patterns may include a plurality of bottom landing via pads arranged beneath the landing vias within the landing via region and a plurality of inner output lead lines respectively connected to the bottom landing via pads and extended along the second direction across the first long side of the chip mounting region.

In another embodiment, the COF package may further include a plurality of outer output conductive patterns formed on the top surface of the base film and respectively connected to chip outer output pads formed on the bottom surface of the semiconductor chip.

In another embodiment, the outer output conductive patterns may include a plurality of top outer output pads arranged along the first direction within the output pad region and a plurality of outer output lead lines respectively connected to the top outer output pads and extended along the second direction across the first long side of the chip mounting region.

In another embodiment, the bottom inner output conductive patterns may include a plurality of inner output lead lines formed on the bottom surface of the base film and extended along the second direction across the first long side of the chip mounting region. The outer output conductive patterns may include the outer output lead lines formed on the top surface of the base film and extended along the second direction across the first long side of the chip mounting region. The inner output lead lines and the outer output lead lines may be arranged alternatively one by one along the first direction.

In another embodiment, the COF package may further include a plurality of top input conductive patterns formed on the top surface of the base film and respectively connected to chip input pads formed on the bottom surface of the semiconductor chip.

In another embodiment, the top input conductive patterns may include a plurality of top input pads arranged along the first direction within the input pad region and a plurality of top input lead lines respectively connected to the top input pads and extended along the second direction across the second long side of the chip mounting region.

In another embodiment, the COF package may further include a plurality of bottom input conductive patterns formed on the bottom surface of the base film and a plurality of input vias formed to vertically penetrate the base film and to respectively connect the top input conductive patterns and the bottom input, the input vias arranged along the first direction.

In another embodiment, the bottom input conductive patterns may include a plurality of bottom input via pads arranged beneath the input vias and a plurality of bottom input lead lines respectively connected to the bottom input via pads and extended along the second direction.

In another embodiment, the base film may include a bending region corresponding to an end portion of the base film that is bent such that the bottom surface of the bending region faces upwards.

According to example embodiments, a chip-on-film (COF) package includes a base film, a semiconductor chip mounted on a chip mounting region of a top surface of the base film, a plurality of outer output conductive patterns, a plurality of top inner output conductive patterns, a plurality of bottom inner output conductive patterns, a plurality of top input conductive patterns and a plurality of landing vias. The semiconductor chip includes a plurality of chip outer output pads, a plurality of chip inner output pads and a plurality of chip input pads that are formed on a bottom surface of the semiconductor chip;

The outer output conductive patterns are formed on the top surface of the base film and respectively connected to the chip outer output pads. The top inner output conductive patterns are formed on the top surface of the base film and respectively connected to chip inner output pads. The bottom inner output conductive patterns are formed on a bottom surface of the base film. The top input conductive patterns are formed on the top surface of the base film and respectively connected to the chip input pads. The landing vias are formed to vertically penetrate the base film and to respectively connect the top inner output conductive patterns and the bottom inner output conductive patterns. The landing vias are arranged within the chip mounting region to form a two-dimensional shape.

According to example embodiments, a display device includes a display panel and a chip-on-film (COF) package configured to drive the display panel. The COF package includes a base film, a display driver chip mounted on a chip mounting region of a top surface of the base film, a plurality of top inner output conductive patterns formed on the top surface of the base film and respectively connected to chip inner output pads formed on a bottom surface of the semiconductor chip, a plurality of bottom inner output conductive patterns formed on a bottom surface of the base film and connected to the display panel and a plurality of landing vias formed to vertically penetrate the base film and to respectively connect the top inner output conductive patterns and the bottom inner output conductive patterns. The landing vias are arranged within the chip mounting region to form a two-dimensional shape.

In one embodiment, the COF package may further include a plurality of outer output conductive patterns formed on the top surface of the base film and respectively connected to chip outer output pads formed on the bottom surface of the semiconductor chip and a plurality of top input conductive patterns formed on the top surface of the base film and respectively connected to chip input pads formed on the bottom surface of the semiconductor chip.

According to another aspect, a chip-on-film (COF) package is provided. The COF package may comprises a base film; a semiconductor chip mounted on a chip mounting region of a top surface of the base film; a plurality of top inner output conductive patterns formed on the top surface of the base film and respectively connected to chip inner output pads formed on a bottom surface of the semiconductor chip; a plurality of bottom inner output conductive patterns formed on a bottom surface of the base film; and a plurality of landing vias formed to penetrate the base film and to connect the top inner output conductive patterns and the bottom inner output conductive patterns, respectively, the plurality of landing vias arranged in a plurality of rows substantially parallel with each other within the chip mounting region.

In one embodiment, the chip mounting region may have a substantially rectangular shape with first and second long sides along a first direction and first and second short sides along a second direction substantially perpendicular to the first direction. The chip mounting region may include an output pad region adjacent to the first long side, an input pad region adjacent to the second long side and a landing via region between the output pad region and the input pad region. The top inner output conductive patterns may include a plurality of inner output pads arranged along the first direction within the output pad region; a plurality of top landing via pads arranged on the landing vias within the landing via region; and a plurality of inner connection lines respectively connecting the inner output pads and the top landing via pads.

In another embodiment, the plurality of rows of the landing vias may be arranged along the first direction, and a number of the landing vias in a row adjacent to the input pad region is greater than or equal to a number of the landing vias in a row farther away from the input pad region.

In another embodiment, the plurality of rows of the landing vias may be arranged substantially parallel to a line that forms an angle to the first and second long sides of the chip mounting region.

The COF package according to example embodiments may include the landing vias that are arranged in a two-dimensional shape to reduce the size of the COF package and enhance productivity of devices and systems including the COF package.

According to another aspect, a base film for a chip-on-film (COF) package is provided. The base film may comprise a base film body comprising a top surface and a bottom surface; a chip mounting region disposed on the top surface of the base film body, the chip mounting region capable of receiving a semiconductor chip, the chip mounting region comprising first, second, third and fourth sides, the first and second sides being opposite each other, the third and fourth sides being opposite each other, the first and second sides being longer than the third and fourth sides, the first and second sides extending in a first direction, the third and fourth sides extending in a second direction, and the first and second directions being substantially perpendicular from each other; a plurality of top inner output conductive patterns formed on the top surface of the base film body, each top inner output conductive patterns comprising a first top pad, a second top pad and a top connection line connecting the first top pad and the second top pad; a plurality of bottom inner output conductive patterns formed on the bottom surface of the base film body, each bottom inner output conductive pattern comprising a first bottom pad, a second bottom pad and a bottom connection line connecting the first bottom pad and a second bottom pad; and a first plurality of landing vias formed in the chip mounting region, each landing via of the first plurality of landing vias connecting a second top pad to a corresponding second bottom pad through the base film body, wherein the landing vias are arranged so that the landing vias of at least one group of the first plurality of landing vias are substantially aligned in the first direction, and a number of landing vias in the at least one group comprises fewer landing vias that a total number of landing vias in the first plurality of landing vias.

In one embodiment, the first plurality of landing vias may comprise a plurality of groups of landing vias, each landing via in a group being substantially aligned in the first direction with other landing vias of the group.

In one embodiment, each group of landing vias may comprise a different number of landing vias in comparison to another group of landing vias.

In one embodiment, a pair of groups of landing vias may comprise a same number of landing vias, and each pair of groups comprises a different number of landing vias in comparison to a number of landing vias in another pair of groups of landing vias.

In one embodiment, at least a portion of the landing vias of the first plurality of landing may be arranged to form a triangular shape of landing vias.

In one embodiment, at least one top connection line may extend in the first direction and in the second direction.

In one embodiment, at least one bottom connection line may extend in the first direction and in the second direction.

In one embodiment, at least one bottom connection line may extend in the first direction and in the second direction.

In one embodiment, the chip mounting region may be substantially rectangularly shaped.

In one embodiment, the base film may further comprise a semiconductor chip on the chip mounting region.

In one embodiment, the semiconductor chip may comprise a plurality of first inner output terminals, each first inner output terminal corresponding to a first top pad of the plurality of top inner output conductive patterns; and a plurality of second inner output terminals, each second inner output terminal corresponding to a first bottom pad of the plurality of bottom inner output conductive patterns.

BRIEF DESCRIPTION OF THE DRAWINGS

Example embodiments of the inventive concept will be more clearly understood from the following detailed description taken in conjunction with the accompanying drawings.

FIG. 1 is a perspective view of a display system according to example embodiments.

FIG. 3 is a diagram illustrating an example layout of a bottom surface of a semiconductor chip included in a COF package according to example embodiments.

FIGS. 4A, 4B and 4C are diagrams illustrating a COF package according to an example embodiment.

FIGS. 5, 6A, and 6B are diagrams illustrating arrangements of landing vias according to example embodiments.

FIGS. 9A, 9B and 9C are diagrams illustrating a COF package according to still another example embodiment.

DETAILED DESCRIPTION OF THE EMBODIMENTS

Figure 2:
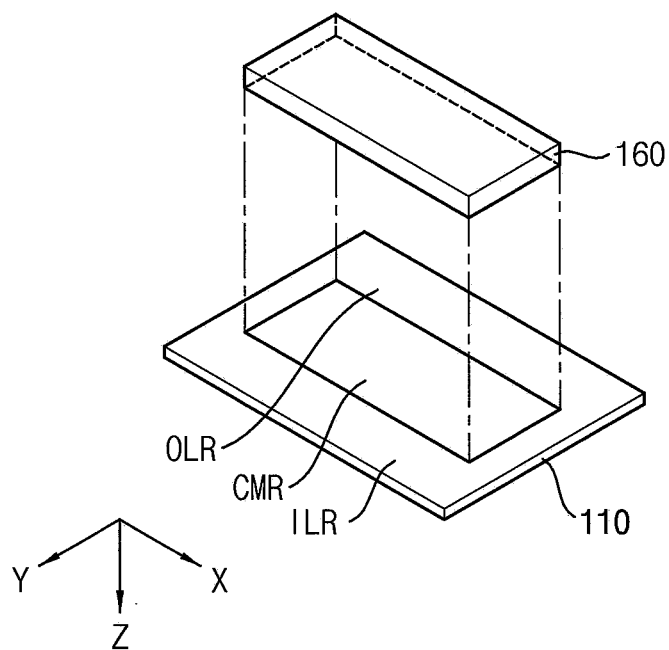
FIG. 2 is a perspective view of a chip-on-film (COF) package according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view of a display system according to example embodiments, and FIG. 2 is a perspective view of a chip-on-film (COF) package according to example embodiments.

Referring to FIG. 1, a display device 10 includes a COF package 100, a display panel 200 and a printed circuit board (PCB) 300.

The display panel 200 may be a liquid crystal display panel or an electroluminescent display panel such as an organic light emitting display panel. The display panel 200 may include a display region for displaying images and a peripheral region surrounding the display region. The display panel 200 may include a top panel, a bottom panel, organic light emitting structures or liquid crystal structures between the top and bottom panels, a plurality of gate lines, a plurality of data lines, etc. Each of the top panel and the bottom panel may be implemented with a glass substrate, a quartz substrate, a transparent plastic substrate, etc. When the transparent plastic panels are used, the display panel 200 may be flexible. For example, also the PCB 300 may be a flexible printed circuit board. The PCB 300 may receive signals from an external device to provide the received signals to the COF package 100.

The COF package 100 may process the signals received through the PCB 300 to output driving signals for driving the display panel 200. A first end portion of the COF package 100 may be attached to the display panel 200 and a second end portion of the COF package 100 may be attached to the PCB 300. For example, the top surface and the bottom surface of the COF package 100 may be attached to the display panel 200 and the PCB 300, respectively. As will be described with reference to FIGS. 8A, 8B and 8C, the COF package 100 may include a bending region at the first end portion attached to the display panel 200.

Referring to FIG. 2, the COF package may include a base film 110 and a semiconductor chip 160.

The semiconductor chip 160 may be mounted on a chip mounting region CMR of a top surface of the base film 110. The chip mounting region CMR may have a rectangular shape with first and second long sides along a first direction X and first and second short sides along a second direction Y perpendicular to the first direction X. The first direction X may be referred to as a long-side direction and the second direction Y may be referred to as a short-side direction. A third direction Z is a vertical direction perpendicular to both of the first direction X and the second direction Y.

The semiconductor chip 160 may be a display driver chip or a display driver integrated circuit (DDIC) chip. In this case, the semiconductor chip 160 may include a timing controller, a gate driver, a data driver, a buffer memory, etc. The first end portion of the COF package 100 may correspond to an output lead region OLR where output lead lines are formed and the second end portion of the COF package 100 may correspond to an input lead region ILR where input lead lines are formed. The first end portion or the output lead region OLR may be attached to the display panel 200 and the second end portion or the input lead region ILR may be attached to the PCB 300.

As will be described below with reference to FIGS. 4A, 4B and 4C, the base film 110 may have a wiring structure where conductive patterns are formed on the top surface and the bottom surface of the base film 110 to connect the semiconductor chip 160 to other devices. A plurality of top inner output conductive patterns may be formed on the top surface of the base film 110 and the top inner output conductive patterns may be respectively connected to chip inner output pads formed on the bottom surface of the semiconductor chip 160. A plurality of bottom inner output conductive patterns may be formed on the bottom surface of the base film 110 and a plurality of landing vias may be formed to vertically penetrate the base film 110 and to respectively connect the top inner output conductive patterns and the bottom inner output conductive patterns. According to example embodiments, the landing vias may be arranged within the chip mounting region CMR to form a two-dimensional shape. For example, as illustrated in FIGS. 5 and 6, the landing vias may be arranged to form at least one triangular shape. The COF package according to example embodiments may reduce the size of the COF package by arranging the landing vias in a two-dimensional shape and thus enhance productivity of devices and systems including the COF package.

FIG. 3 is a diagram illustrating an example layout of a bottom surface of a semiconductor chip included in a COF package according to example embodiments.

Referring to FIG. 3, a bottom surface of a semiconductor chip 160 may include a first region 161, a second region 162 and a third region 163. The first region 161 may correspond to an output pad region OPR in the chip mounting region CMR of the base film 110, the second region 162 may correspond to a landing via region LVR in the chip mounting region CMR of the base film 110 and the third region 163 may correspond to an input pad region IPR in the chip mounting region CMR of the base film 110. Chip outer output pads COPO and chip inner output pads COPI may be formed in the first region 161 and chip input pads CIP may be formed in the third region 163. The chip outer output pads COPO, the chip inner output pads COPI and the chip input pads CIP may be arranged along the first direction X. The chip outer output pads COPO and the chip inner output pads COPI are for providing signals to the display panel 200 and the chip input pads CIP are for receiving signals from the PCB 300. The number of the chip output pads COPO and COPI is significant when the semiconductor chip 160 is a DDIC chip for driving the display panel 200 of high resolution. In this case, the bottom surface of the semiconductor chip 160 may have a rectangular shape such that the length LNGX of the long side is sufficiently larger than the length LNGY of the short side. FIG. 3 illustrates a non-limiting example where the chip output pads COPO and COPI are arranged in two rows along the long-side direction that is, along the first direction X, but the output pads may be arranged in three or more rows.

Figure 4A:
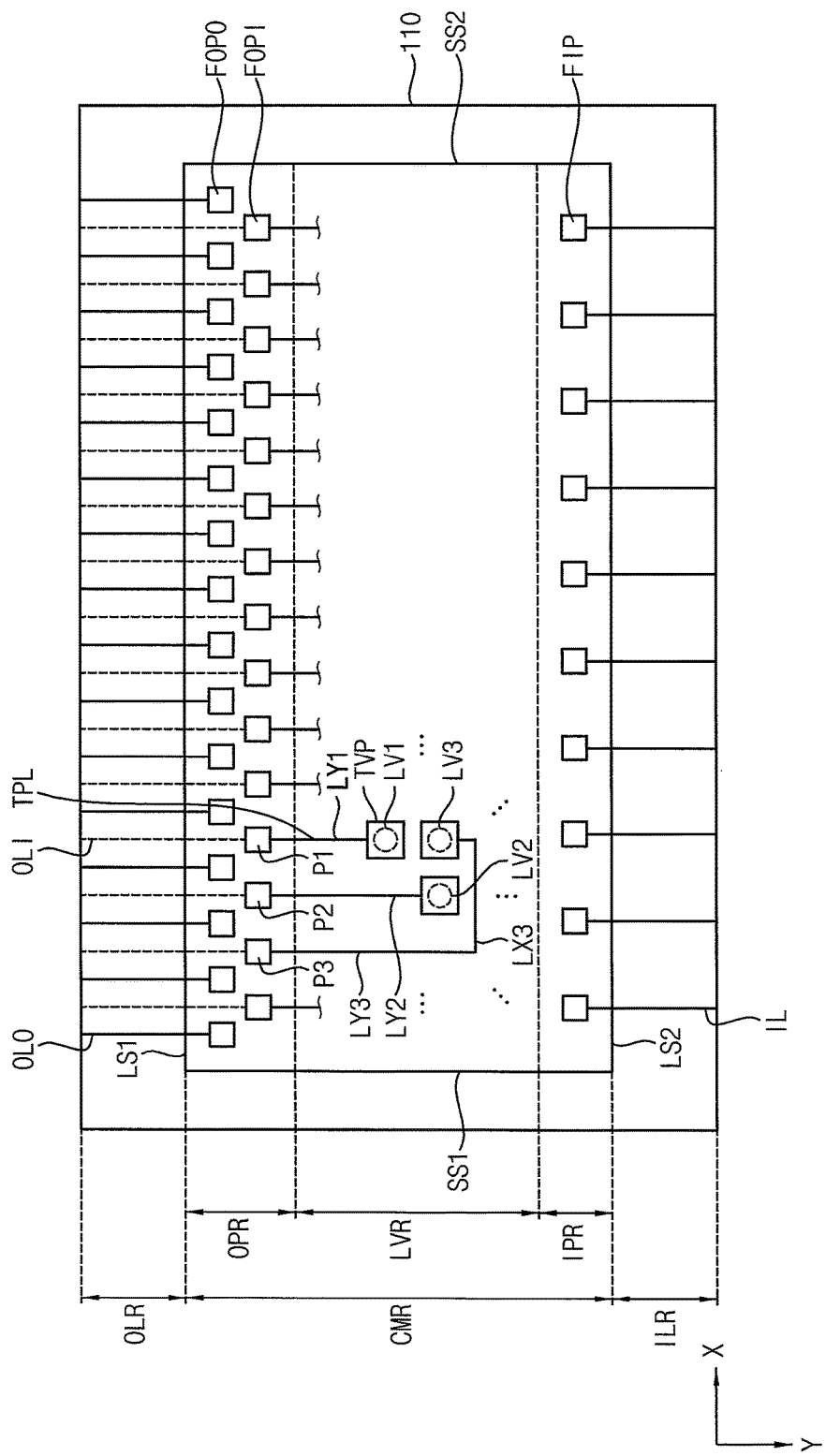
Figure 4B:
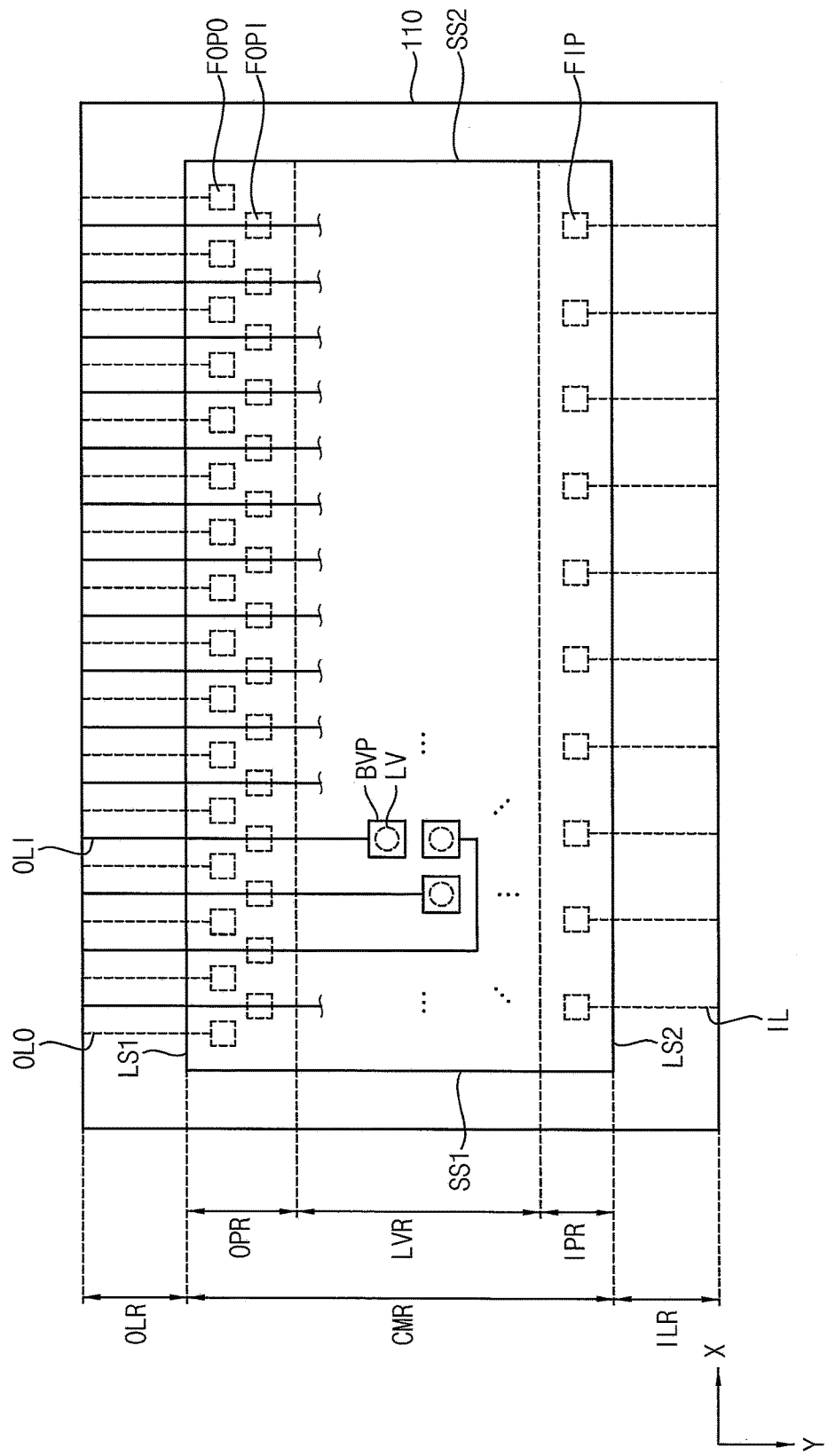
Figure 5:
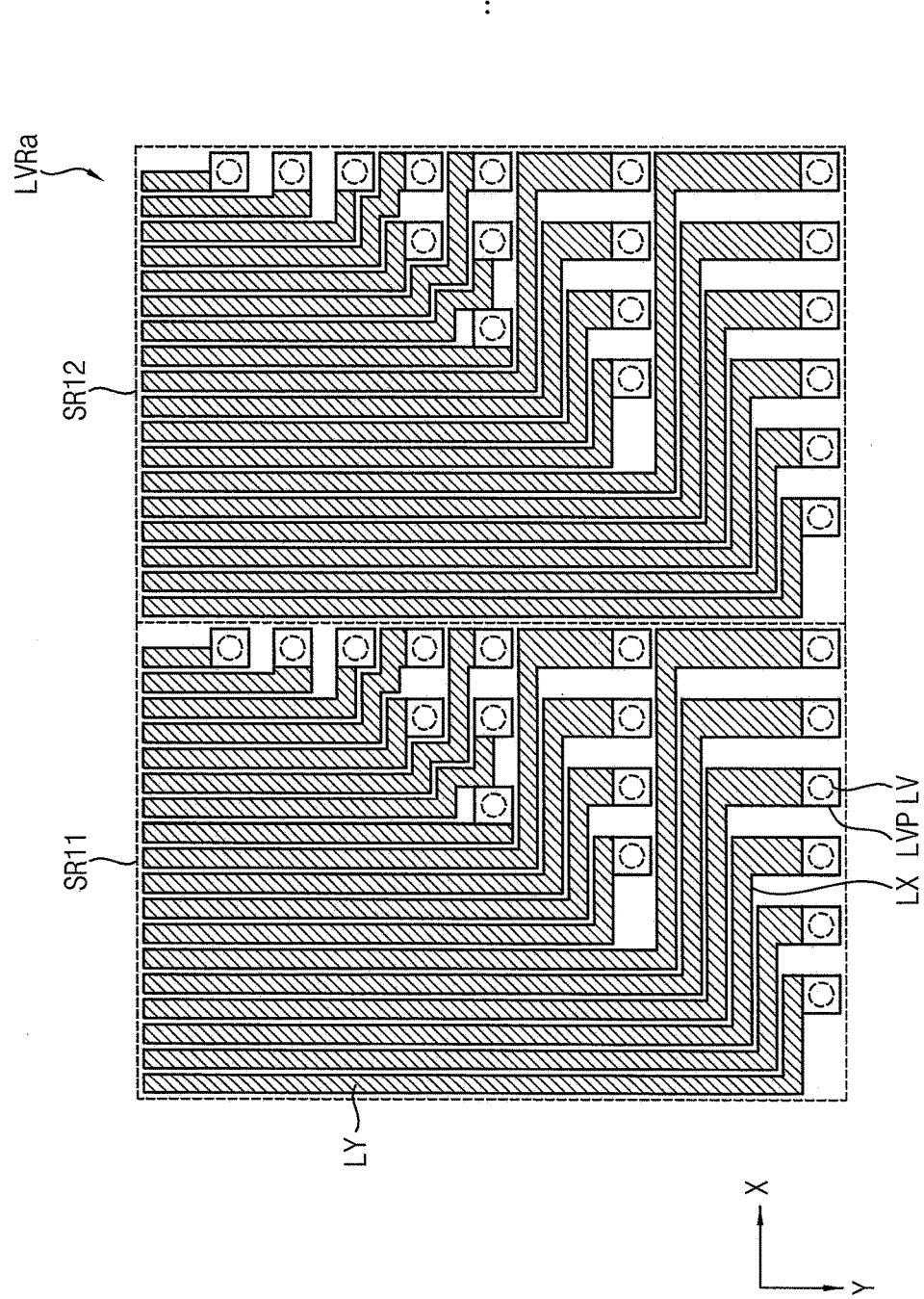

FIGS. 4A, 4B and 4C are diagrams illustrating a COF package according to an example embodiment.

FIG. 4A shows a layout of a top surface of a base film 110, FIG. 4B shows a layout of a bottom surface of the base film 110 and FIG. 4C shows a cross-sectional view representing a vertical structure of a COF package 100. FIG. 4B does not show a bottom view of the bottom surface, but both of FIGS. 4A and 4B show top views of the top surface and the bottom surface respectively for simple comparison of the layouts of the top surface and the bottom surface.

As illustrated in FIGS. 4A and 4B, the base film 110 may include an output lead region OLR where output lead lines OLO and OLI are formed, a chip mounting region CMR where the semiconductor chip 160 is mounted and an input lead region ILR where input lead lines IL are formed. The chip mounting region CMR may have a rectangular shape with first and second long sides LS1 and LS2 along the first direction X and first and second short sides SS1 and SS2 along the second direction Y perpendicular to the first direction X. The chip mounting region CMR may include an output pad region OPR adjacent to the first long side LS1, an input pad region IPR adjacent to the second long side LS2 and a landing via region LVR between the output pad region OPR and the input pad region IPR.

Referring to FIGS. 4A, 4B and 4C, the COF package 100 may include the base film 110, the semiconductor chip 160, a plurality of top inner output conductive patterns FOPI, TPL and TVP, a plurality of bottom inner output conductive patterns BVP and OLI, a plurality of landing vias LV, a plurality of outer output conductive patterns FOPO and OLO and a plurality of top input conductive patterns IL and FIP.

The top inner output conductive patterns FOPI, TPL and TVP may be formed on the top surface of the base film 110 and may be respectively connected to the chip inner output pads COPI formed on the bottom surface of the semiconductor chip 160 of FIG. 3. The top inner output conductive patterns FOPI, TPL and TVP may include a plurality of inner output pads FOPI, a plurality of top landing via pads TVP and a plurality of inner connection lines TPL. The inner output pads may be arranged along the first direction X within the output pad region OPR. The top landing via pads TVP may be arranged on the landing vias LV within the landing via region LVR. The inner connection lines TPL may connect the inner output pads FOPI and the top landing via pads TVP, respectively.

The bottom inner output conductive patterns BVP and OLI may include a plurality of bottom landing via pads BVP and a plurality of inner output lead lines OLI, which are formed on the bottom surface of the base film 110. The bottom landing via pads BVP may be arranged beneath the landing vias LV within the landing via region LVR. The inner output lead lines OLI may be respectively connected to the bottom landing via pads BVP and may be extended along the second direction Y across the first long side LS1 of the chip mounting region CMR.

The landing vias LV may be formed to vertically penetrate the base film 110 and to respectively connect the top landing via pads TVP of the top inner output conductive patterns and the bottom landing via pads BVP of the bottom inner output conductive patterns.

According to example embodiments, the landing vias LV may be arranged within the chip mounting region CMR, more specifically in the landing via region LVR, to form a two-dimensional shape. For such two-dimensional shape, at least two landing vias LV connected to at least two adjacent inner output pads FOPI may be adjacent and arranged along the first direction X. At least one inner connection line TPL among the inner connection lines connected to the at least two landing vias may include a first line and a second line such that the first line is connected to the corresponding top landing via pad and extended along the first direction X and the second line connects the first line and the corresponding inner output pad and is extended along the second direction Y.

For example, as illustrated in FIG. 4A, the inner output pads FOPI may include a first inner output pad P1, a second inner output pad P2 and a third inner output pad P3, which are adjacent along the first direction X. The landing vias LV may include a first landing via LV1, a second landing via LV2 and a third landing via LV3 corresponding to the first, second and third inner output pads P1, P2 and P3, respectively. The second and third landing vias LV2 and LV3 connected to the adjacent second and third inner output pads P2 and P3 may be adjacent and arranged along the first direction X. Among the inner connection lines TPL connected to the second and third landing vias LV2 and LV3, the inner connection line LX3 and LY3 connected to the third landing via LV3 may include a first line LX3 and a second line LY3. The first line LX3 may be connected to the corresponding top landing via pad, that is, the third landing via VL3, and may be extended along the first direction X. The second line LY3 may be connects the first line LX3 and the corresponding inner output pad, that is, the third inner output pad P3, and may be extended along the second direction Y. In contrast, the first line extended along the first direction X may be omitted with respect to the first and second top landing via pads of the first and second landing vias LV1 and LV2, and the first and second top landing via pads may be connected to the corresponding inner output pads P1 and P2 through the second lines LY1 and LY2, respectively. As illustrated in FIGS. 5 and 6, a plurality of landing vias LV may be adjacent and arranged along the first direction X, and the adjacent landing vias LV may be respectively connected to second lines LY extended along the second direction Y using first lines LX extended along the first direction X.

The outer output conductive patterns FOPO and OLO may be formed on the top surface of the base film 110 and may be respectively connected to the chip outer output pads COPO formed on the bottom surface of the semiconductor chip 160 of FIG. 3. The outer output conductive patterns FOPO and OLO may include a plurality of top outer output pads FOPO and a plurality of outer output lead lines OLO. The top outer output pads FOPO may be arranged along the first direction X within the output pad region OPR. The outer output lead lines OLO may be respectively connected to the top outer output pads FOPO and may be extended along the second direction Y across the first long side LS1 of the chip mounting region CMR.

As illustrated in FIGS. 4A and 4B, the inner output lead lines OLI formed on the bottom surface of the base film 110 and the outer output lead lines OLO formed on the top surface of the base film 110 may be arranged alternatively one by one along the first direction X.

The top input conductive patterns IL and FIP may be formed on the top surface of the base film 110 and may be respectively connected to chip input pads CIP formed on the bottom surface of the semiconductor chip 160 of FIG. 3. The top input conductive patterns IL and FIP may include a plurality of top input pads FIP and a plurality of top input lead lines IL. The top input pads HP may be arranged along the first direction X within the input pad region IPR. The top input lead lines IL may be respectively connected to the top input pads FIP and may be extended along the second direction Y across the second long side LS2 of the chip mounting region CMR.

As illustrated in FIG. 4C, the COF package 100 may further include an underfill portion 170 and a protection layer 180.

The underfill portion 170 may cover the side portion of the semiconductor chip 160 that is mounted on the top surface of the base film 110. The underfill portion 170 may be implemented with resin to fill the space between the bottom surface of the semiconductor chip 160 and the top surface of the base film 110. The semiconductor chip 160 may be mounted and fixed on the top surface of the base film 110 by the underfill portion 170. In addition, connections between bumps of the semiconductor chip 160 and the pads FOPO, FOPI and FIP on the top surface of the base film 110 may be protected by the underfill portion 170.

The protection layer 180 may be formed on the top and bottom surfaces of the base film 110, respectively. The protection layer 180 may be implemented with solder resist or other materials. For example, as illustrated in FIG. 4C, the protection layer 180 may be formed on the top and bottom surface to expose output terminals OTO and OTI, input terminals IT and the semiconductor chip 160. The output terminals OTO and OTI may be connected to terminals of the display panel 200 of FIG. 1 to transfer signals from the semiconductor chip 160 to the display panel 200. The input terminals IT may be connected to terminals of the PCB 300 of FIG. 1 to transfer signals from an external device to the semiconductor chip 160. Adhesive films may be deposited between the input and output terminals OTO, OTI and IT of the COF package 100 and the terminals of the other devices. The adhesive film may be an anisotropic conducting film (ACF).

In some example embodiments, the base film 110 may be implemented as a resin film including polyimide, polyester, etc. The base film 110 may have flexibility and the base film may include a bending region BNR as will be described with reference to FIGS. 8A, 8B and 8C. The conductive patterns OLO, TPL, IL, OLI, FOPO, FOPI, FIP, TVP and BVP and/or the landing vias LV may be implemented with metals such as copper Cu, nickel Ni, aluminum Al, etc.

Figure 6B:
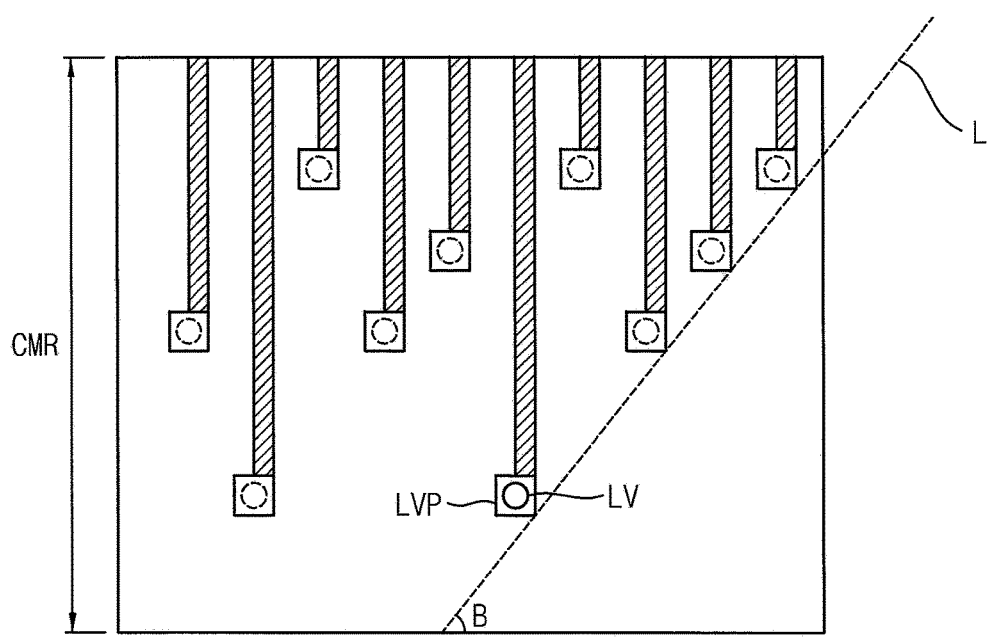

FIGS. 5, 6A and 6B are diagrams illustrating arrangements of landing vias according to example embodiments.

Referring to FIGS. 5 and 6A, a landing via region LVRa or LVRb may include a plurality of sub-regions SR11 and SR12 or SR21 and SR22. As described above, a plurality of landing vias LV and a plurality of landing via pads LVP may be adjacent and arranged along the first direction X, and the adjacent landing vias LV may be connected to the adjacent second line LY extended along the second direction through the first lines LX extended the first direction X. FIGS. 5 and 6A illustrate example embodiments where the landing vias LV form at least one triangular shape.

In an example embodiment, as illustrated in FIG. 5, the sub-regions SR11 and S12 may have a same arrangement of the landing vias LV. In another example embodiment, as illustrated in FIG. 6A, the two adjacent sub-regions SR21 and SR22 may have a symmetric arrangement of the landing vias LV with respect to a boundary line BNL of the two adjacent sub-regions SR21 and SR22.

It should be appreciated the arrangements of the landing vias LV are not limited to the illustrated embodiments. The landing vias LV may be arranged in two dimensions in any suitable manner that reduces the area required to accommodate the inner outer output conductive pattern (FOPI, TPL and TVP) and outer output conductive pattern (FOPO and OLO) of the base film (referring to FIG. 4A). For example, the landing vias LV may be arranged in a plurality of rows parallel with each other. In some embodiments, for example, the rows of the landing vias LV may be substantially parallel to a side of the chip mounting region (CMR) in a first direction X (referring to FIG. 4A). A number of landing vias LV in a row adjacent to an input pad region IPR is greater than or equal to a number of the landing vias LV in a row farther away from the input pad region IPR. In other words, the number of landing vias in each row decreases along a second direction Y toward an output pad region OPR. In some embodiments, the landing vias LV may be arranged such that one or more landing vias may face the output pad region OPR and may be connected to the inner output pad through a lead line directly or in one direction. In one embodiment, the rows of the plurality of the landing vias LV may be arranged to form a triangular shape. In another embodiment, the rows of the plurality of the landing vias LV may be arranged to form a trapezoidal shape.

In some embodiments, the rows of the landing vias may be parallel and arranged substantially parallel to a line L that forms an angle B with a side of the chip mounting region CMR in the first direction X as illustrated in FIG. 6B. The angle of the line L, a distance between the rows and a number of landing vias LV in each row may be configured to facilitate the layout of the connection lines between the landing via pads LVP and the inner output pads (FOPI) or accommodate the inner outer output conductive pattern (FOPI, TPL and TVP) and outer output conductive pattern (FOPO and OLO) of the base film (referring to FIG. 4A).

Figure 7:
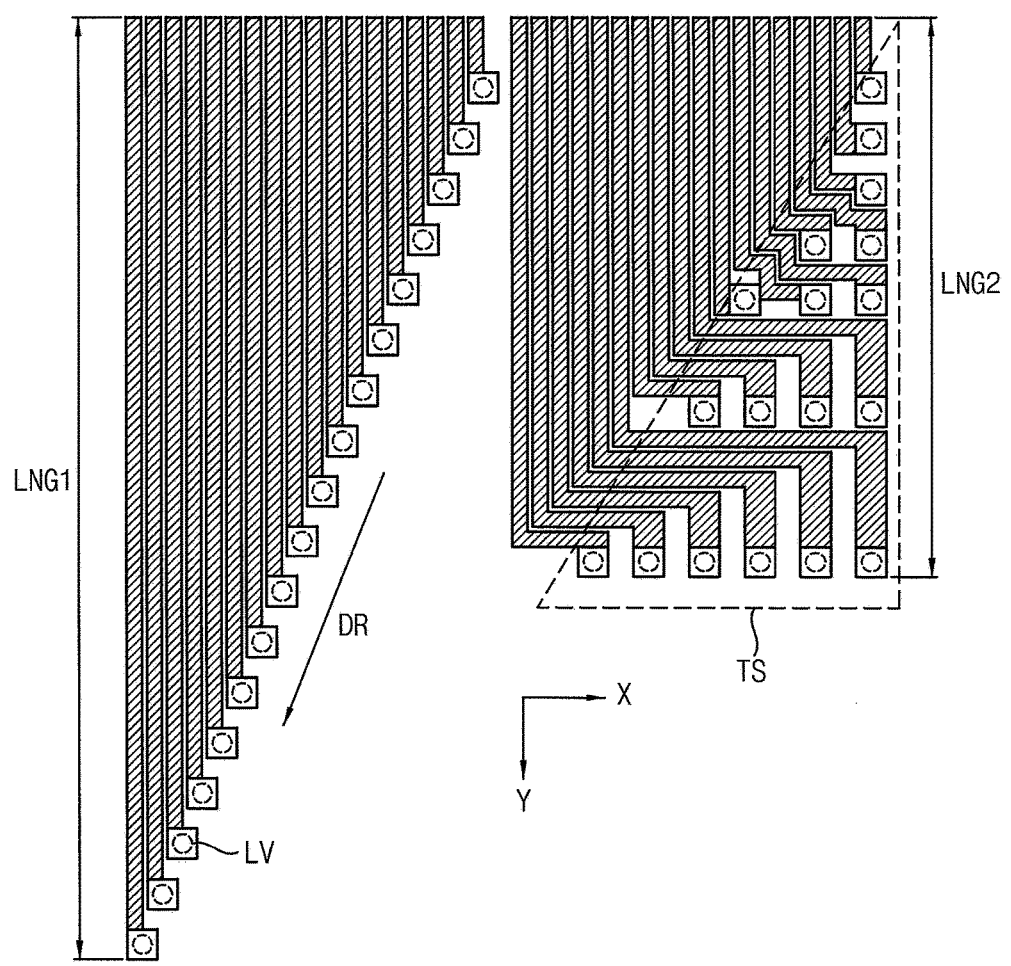
FIG. 7 is a diagram illustrating a size shrink effect according to example embodiments.

FIG. 7 is a diagram illustrating a size shrink effect according to example embodiments.

A layout in the left portion of FIG. 7 shows that the landing vias LV form a one-dimensional shape, that is, a line along a diagonal direction DR. In contrast, a layout in the right portion of FIG. 7 shows that the landing vias LV form a two-dimensional shape, e.g., a triangular shape TS. As shown in FIG. 7, the length LNG2 along the second direction Y in case of arranging the landing vias LV in a two-dimensional shape may be significantly reduced in comparison with the length LNG1 along the second direction Y in case of arranging the landing vias LV in a one-dimensional shape. As such, the COF package according to example embodiments may reduce the size of the COF package by arranging the landing vias in a two-dimensional shape and thus enhance productivity of devices and systems including the COF package.

Figure 8A:
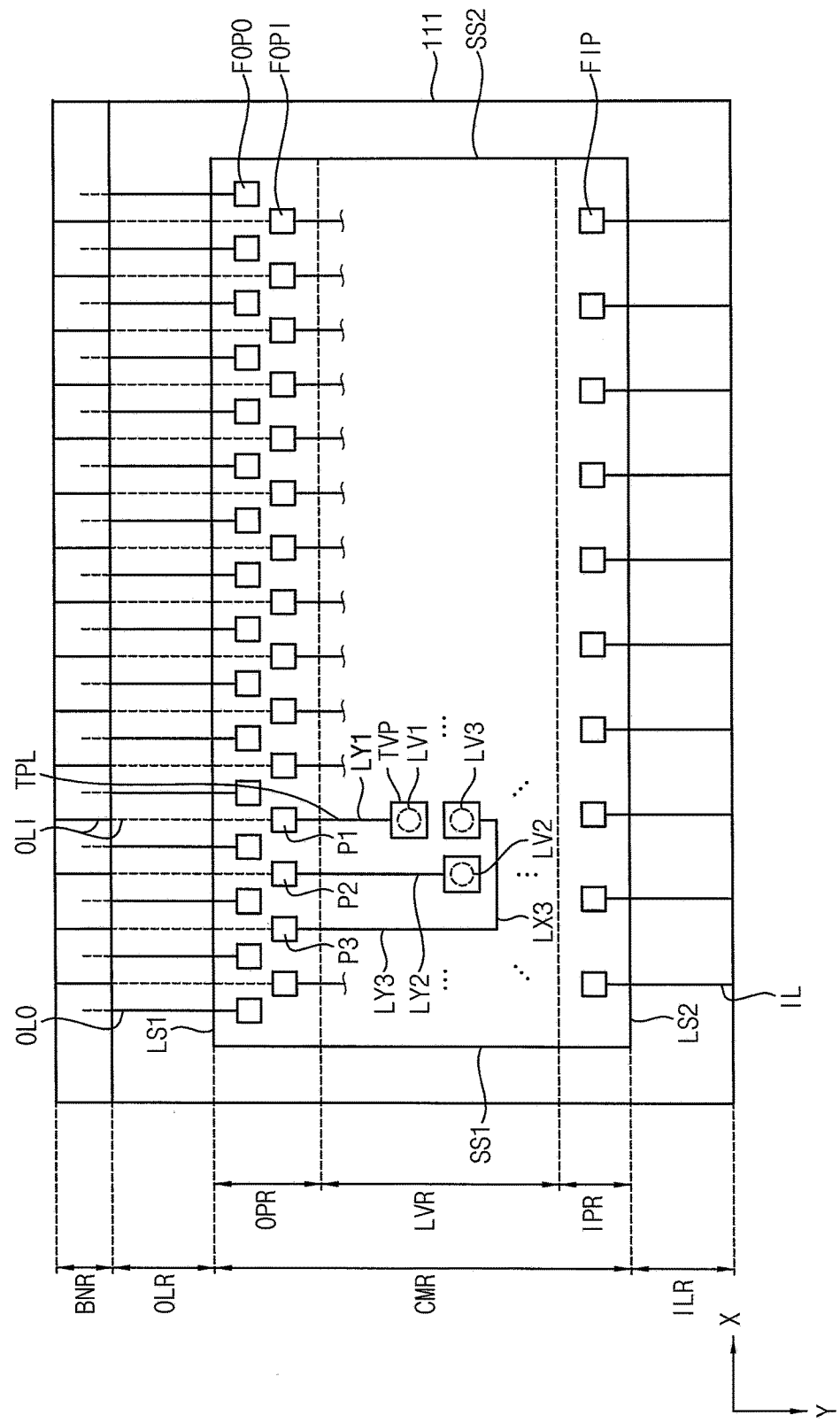
FIGS. 8A, 8B and 8C are diagrams illustrating a COF package according to another example embodiment.
Figure 8B:
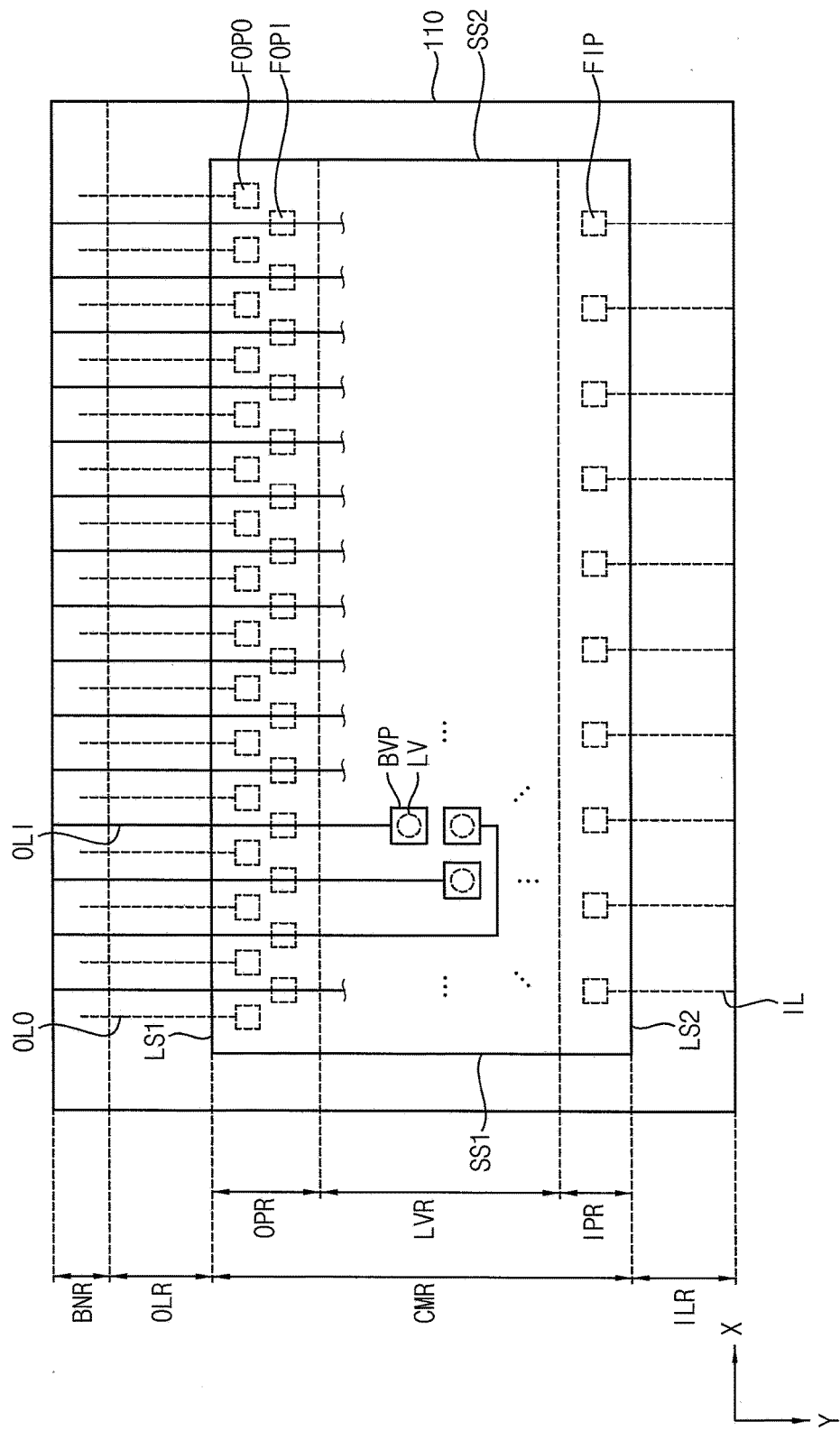
Figure 8C:
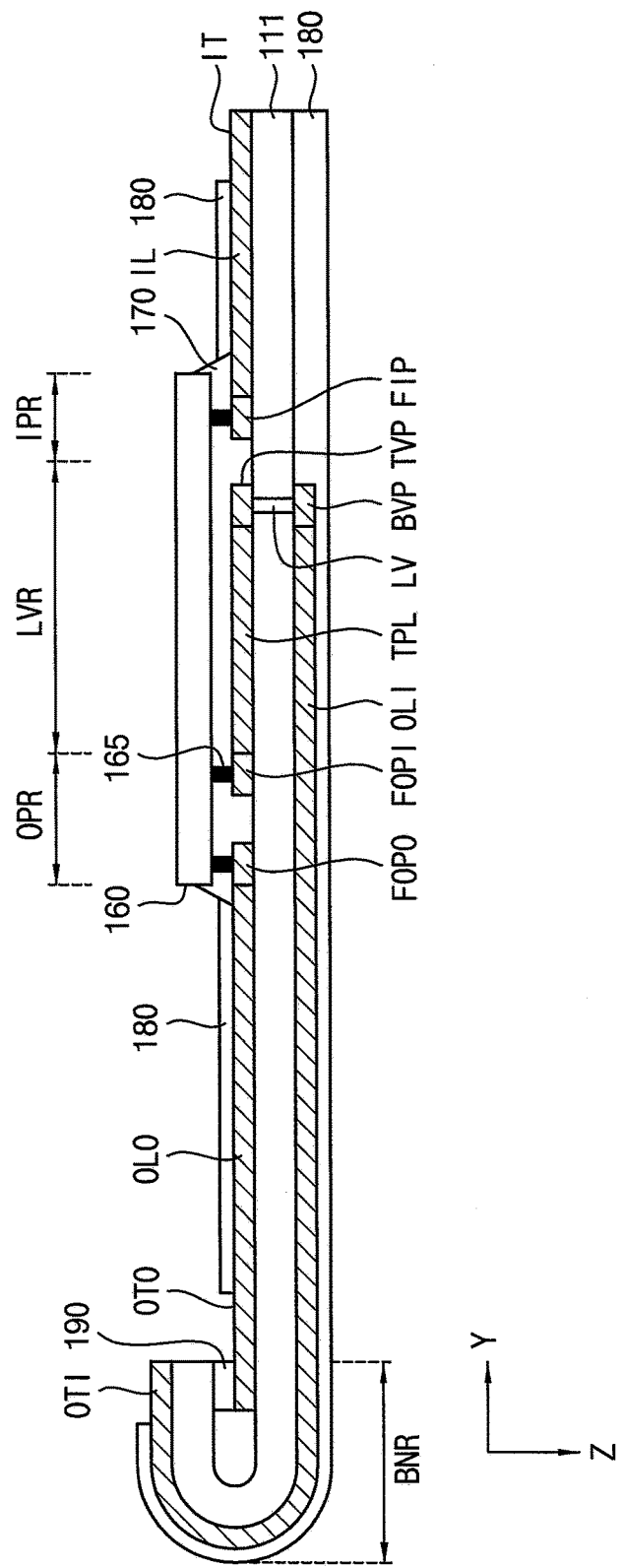

FIGS. 8A, 8B and 8C are diagrams illustrating a COF package according to another example embodiment.

FIG. 8A shows a layout of a top surface of a base film 111, FIG. 8B shows a layout of a bottom surface of the base film 111 and FIG. 8C shows a cross-sectional view representing a vertical structure of a COF package 101. FIG. 8B does not show a bottom view of the bottom surface, but both of FIGS. 8A and 8B show top views of the top surface and the bottom surface respectively for simple comparison of the layouts of the top surface and the bottom surface.

As illustrated in FIGS. 8A and 8B, the base film 111 may include a bending region BNR, an output lead region OLR where output lead lines OLO and OLI are formed, a chip mounting region CMR where the semiconductor chip 160 is mounted and an input lead region ILR where input lead lines IL are formed. The chip mounting region CMR may have a rectangular shape with first and second long sides LS1 and LS2 along the first direction X and first and second short sides SS1 and SS2 along the second direction Y perpendicular to the first direction X. The chip mounting region CMR may include an output pad region OPR adjacent to the first long side LS1, an input pad region IPR adjacent to the second long side LS2 and a landing via region LVR between the output pad region OPR and the input pad region IPR.

The bending region BNR may correspond to an end portion of the base film 111, as illustrated in FIG. 8C, that is bent such that the bottom surface of the bending region faces upwards.

Referring to FIGS. 8A, 8B and 8C, the COF package 101 may include the base film 111, the semiconductor chip 160, a plurality of top inner output conductive patterns FOPI, TPL and TVP, a plurality of bottom inner output conductive patterns BVP and OLI, a plurality of landing vias LV, a plurality of outer output conductive patterns FOPO and OLO and a plurality of top input conductive patterns IL and FIP.

The top inner output conductive patterns FOPI, TPL and TVP may be formed on the top surface of the base film 111 and may be respectively connected to the chip inner output pads COPI formed on the bottom surface of the semiconductor chip 160 of FIG. 3. The top inner output conductive patterns FOPI, TPL and TVP may include a plurality of inner output pads FOPI, a plurality of top landing via pads TVP and a plurality of inner connection lines TPL. The inner output pads may be arranged along the first direction X within the output pad region OPR. The top landing via pads TVP may be arranged on the landing vias LV within the landing via region LVR. The inner connection lines TPL may connect the inner output pads FOPI and the top landing via pads TVP, respectively.

The bottom inner output conductive patterns BVP and OLI may include a plurality of bottom landing via pads BVP and a plurality of inner output lead lines OLI, which are formed on the bottom surface of the base film 111. The bottom landing via pads BVP may be arranged beneath the landing vias LV within the landing via region LVR. The inner output lead lines OLI may be respectively connected to the bottom landing via pads BVP and may be extended along the second direction Y across the first long side LS1 of the chip mounting region CMR.

The landing vias LV may be formed to vertically penetrate the base film 111 and to respectively connect the top landing via pads TVP of the top inner output conductive patterns and the bottom landing via pads BVP of the bottom inner output conductive patterns.

According to example embodiments, the landing vias LV may be arranged within the chip mounting region CMR, more specifically in the landing via region LVR, to form a two-dimensional shape. For such two-dimensional shape, at least two landing vias LV connected to at least two adjacent inner output pads FOPI may be adjacent and arranged along the first direction X. At least one inner connection line TPL among the inner connection lines connected to the at least two landing vias may include a first line and a second line such that the first line is connected to the corresponding top landing via pad and extended along the first direction X and the second line connects the first line and the corresponding inner output pad and is extended along the second direction Y.

For example, as illustrated in FIG. 8A, the inner output pads FOPI may include a first inner output pad P1, a second inner output pad P2 and a third inner output pad P3, which are adjacent along the first direction X. The landing vias LV may include a first landing via LV1, a second landing via LV2 and a third landing via LV3 corresponding to the first, second and third inner output pads P1, P2 and P3, respectively. The second and third landing vias LV2 and LV3 connected to the adjacent second and third inner output pads P2 and P3 may be adjacent and arranged along the first direction X. Among the inner connection lines TPL connected to the second and third landing vias LV2 and LV3, the inner connection line LX3 and LY3 connected to the third landing via LV3 may include a first line LX3 and a second line LY3. The first line LX3 may be connected to the corresponding top landing via pad, that is, the third landing via VL3, and may be extended along the first direction X. The second line LY3 may be connects the first line LX3 and the corresponding inner output pad, that is, the third inner output pad P3, and may be extended along the second direction Y. In contrast, the first line extended along the first direction X may be omitted with respect to the first and second top landing via pads of the first and second landing vias LV1 and LV2, and the first and second top landing via pads may be connected to the corresponding inner output pads P1 and P2 through the second lines LY1 and LY2, respectively. As illustrated in FIGS. 5 and 6, a plurality of landing vias LV may be adjacent and arranged along the first direction X, and the adjacent landing vias LV may be respectively connected to the second lines LY extended along the second direction Y using the first lines LY extended along the first direction X.

The outer output conductive patterns FOPO and OLO may be formed on the top surface of the base film 111 and may be respectively connected to the chip outer output pads COPO formed on the bottom surface of the semiconductor chip 160 of FIG. 3. The outer output conductive patterns FOPO and OLO may include a plurality of top outer output pads FOPO and a plurality of outer output lead lines OLO. The top outer output pads FOPO may be arranged along the first direction X within the output pad region OPR. The outer output lead lines OLO may be respectively connected to the top outer output pads FOPO and may be extended along the second direction Y across the first long side LS1 of the chip mounting region CMR.

As illustrated in FIGS. 8A and 8B, the inner output lead lines OLI formed on the bottom surface of the base film 111 and the outer output lead lines OLO formed on the top surface of the base film 111 may be arranged alternatively one by one along the first direction X.

The top input conductive patterns IL and FIP may be formed on the top surface of the base film 111 and may be respectively connected to chip input pads CIP formed on the bottom surface of the semiconductor chip 160 of FIG. 3. The top input conductive patterns IL and FIP may include a plurality of top input pads FIP and a plurality of top input lead lines IL. The top input pads HP may be arranged along the first direction X within the input pad region IPR. The top input lead lines IL may be respectively connected to the top input pads FIP and may be extended along the second direction Y across the second long side LS2 of the chip mounting region CMR.

As illustrated in FIG. 8C, the COF package 101 may further include an underfill portion 170, a protection layer 180 and an adhesive layer 190.

The underfill portion 170 may cover the side portion of the semiconductor chip 160 that is mounted on the top surface of the base film 111. The underfill portion 170 may be implemented with resin to fill the space between the bottom surface of the semiconductor chip 160 and the top surface of the base film 111. The semiconductor chip 160 may be mounted and fixed on the top surface of the base film 112 by the underfill portion 170. In addition, connections between bumps of the semiconductor chip 160 and the pads FOPO, FOPI and FIP on the top surface of the base film 112 may be protected by the underfill portion 170.

The protection layer 180 may be formed on the top and bottom surfaces of the base film 111, respectively. The protection layer 180 may be implemented with solder resist or other materials. For example, as illustrated in FIG. 8C, the protection layer 180 may be formed on the top and bottom surface to expose output terminals OTO and OTI, input terminals IT and the semiconductor chip 160. In comparison with the inner output terminal OTI of FIG. 4C that is exposed to face downwards, the inner output terminal OTI in the bending region BNR of FIG. 8C is exposed to face upwards. The output terminals OTO and OTI may be connected to terminals of the display panel 200 of FIG. 1 to transfer signals from the semiconductor chip 160 to the display panel 200. The input terminals IT may be connected to terminals of the PCB 300 of FIG. 1 to transfer signals from an external device to the semiconductor chip 160. Adhesive films may be deposited between the input and output terminals OTO, OTI and IT of the COF package 101 and the terminals of the other devices. The adhesive film may be an anisotropic conducting film (ACF).

The adhesive layer 190 may be formed between the surface portions facing each other in the bending region BNR. The bent shape may be maintained through the adhesive layer 190. The adhesive layer 190 may include non-conductive adhesive materials.

In some example embodiments, the base film 111 may be implemented as a resin film including polyimide, polyester, etc. The base film 111 may have flexibility to form the bending region BNR. The conductive patterns OLO, TPL, IL, OLI, FOPO, FOPI, FIP, TVP and BVP and/or the landing vias LV may be implemented with metals such as copper Cu, nickel Ni, aluminum Al, etc.

Figure 9B:
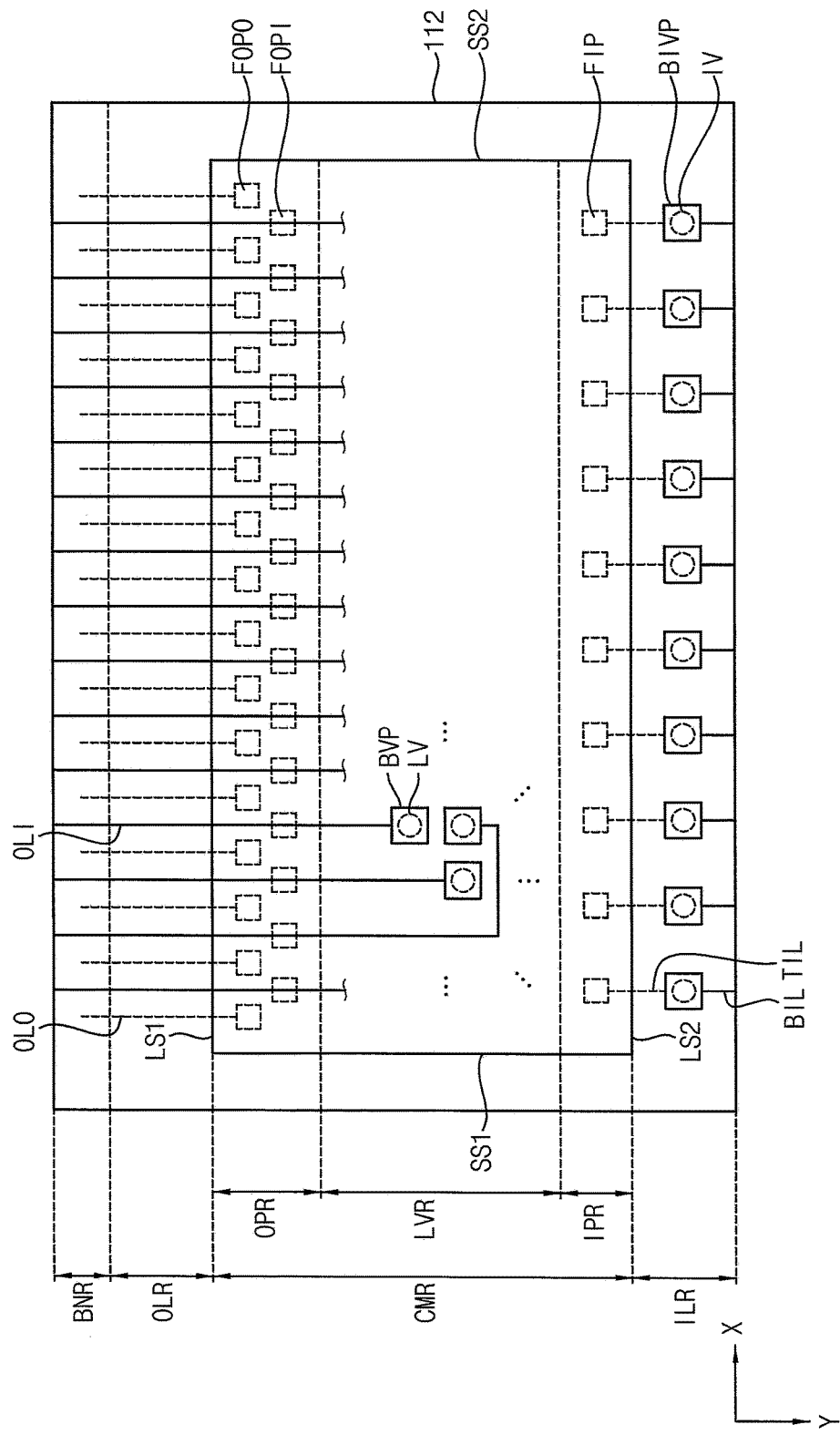
Figure 9C:
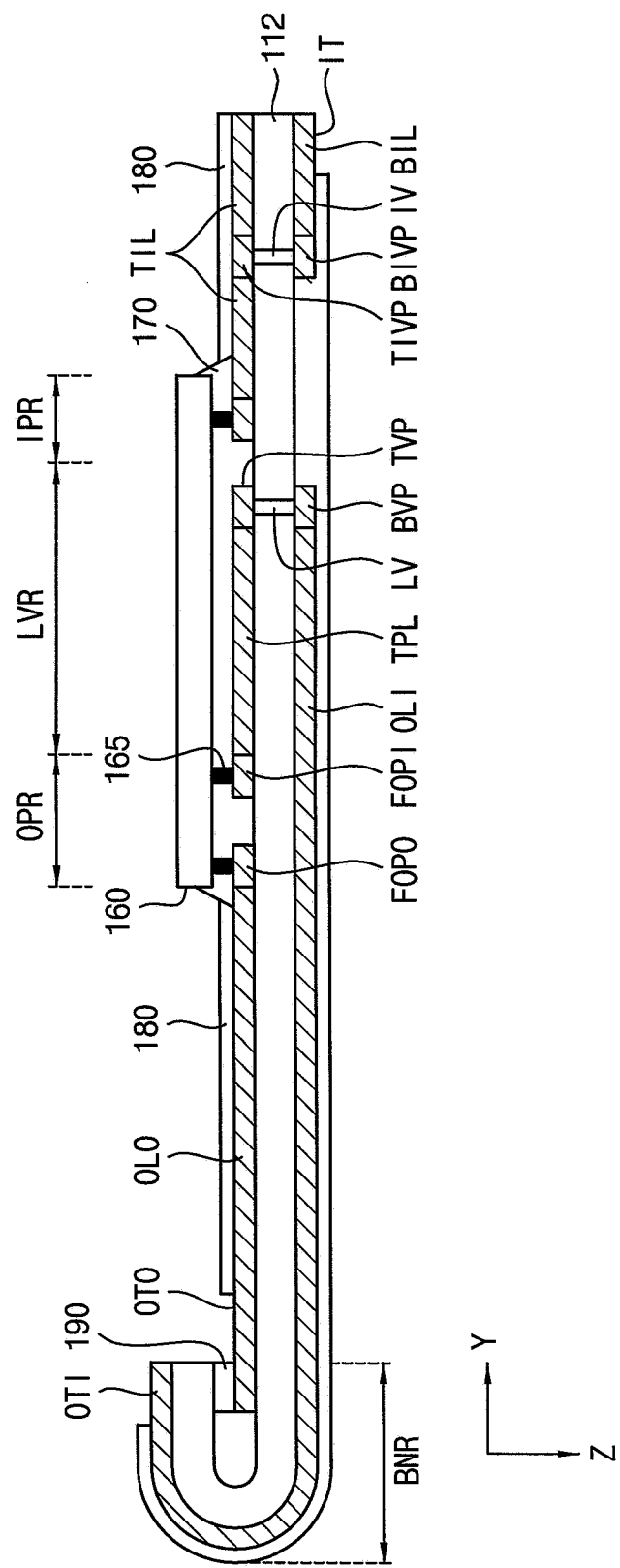

FIGS. 9A, 9B and 9C are diagrams illustrating a COF package according to still another example embodiment.

FIG. 9A shows a layout of a top surface of a base film 112, FIG. 9B shows a layout of a bottom surface of the base film 112 and FIG. 9C shows a cross-sectional view representing a vertical structure of a COF package 102. FIG. 9B does not show a bottom view of the bottom surface, but both of FIGS. 9A and 9B show top views of the top surface and the bottom surface respectively for simple comparison of the layouts of the top surface and the bottom surface.

As illustrated in FIGS. 9A and 9B, the base film 112 may include a bending region BNR, an output lead region OLR where output lead lines OLO and OLI are formed, a chip mounting region CMR where the semiconductor chip 160 is mounted and an input lead region ILR where input lead lines TIL and BIL are formed. The chip mounting region CMR may have a rectangular shape with first and second long sides LS1 and LS2 along the first direction X and first and second short sides SS1 and SS2 along the second direction Y perpendicular to the first direction X. The chip mounting region CMR may include an output pad region OPR adjacent to the first long side LS1, an input pad region IPR adjacent to the second long side LS2 and a landing via region LVR between the output pad region OPR and the input pad region IPR.

The bending region BNR may correspond to an end portion of the base film 112, as illustrated in FIG. 9C, that is bent such that the bottom surface of the bending region faces upwards.

Referring to FIGS. 9A, 9B and 9C, the COF package 102 may include the base film 112, the semiconductor chip 160, a plurality of top inner output conductive patterns FOPI, TPL and TVP, a plurality of bottom inner output conductive patterns BVP and OLI, a plurality of landing vias LV, a plurality of outer output conductive patterns FOPO and OLO, a plurality of top input conductive patterns TIL, TIVP and FIP, a plurality of bottom input conductive patterns BIVP and BIL and a plurality of input vias IV.

The top inner output conductive patterns FOPI, TPL and TVP may be formed on the top surface of the base film 112 and may be respectively connected to the chip inner output pads COPI formed on the bottom surface of the semiconductor chip 160 of FIG. 3. The top inner output conductive patterns FOPI, TPL and TVP may include a plurality of inner output pads FOPI, a plurality of top landing via pads TVP and a plurality of inner connection lines TPL. The inner output pads may be arranged along the first direction X within the output pad region OPR. The top landing via pads TVP may be arranged on the landing vias LV within the landing via region LVR. The inner connection lines TPL may connect the inner output pads FOPI and the top landing via pads TVP, respectively.

The bottom inner output conductive patterns BVP and OLI may include a plurality of bottom landing via pads BVP and a plurality of inner output lead lines OLI, which are formed on the bottom surface of the base film 112. The bottom landing via pads BVP may be arranged beneath the landing vias LV within the landing via region LVR. The inner output lead lines OLI may be respectively connected to the bottom landing via pads BVP and may be extended along the second direction Y across the first long side LS1 of the chip mounting region CMR.

The landing vias LV may be formed to vertically penetrate the base film 112 and to respectively connect the top landing via pads TVP of the top inner output conductive patterns and the bottom landing via pads BVP of the bottom inner output conductive patterns.

According to example embodiments, the landing vias LV may be arranged within the chip mounting region CMR, more specifically in the landing via region LVR, to form a two-dimensional shape. For such two-dimensional shape, at least two landing vias LV connected to at least two adjacent inner output pads FOPI may be adjacent and arranged along the first direction X. At least one inner connection line TPL among the inner connection lines connected to the at least two landing vias may include a first line and a second line such that the first line is connected to the corresponding top landing via pad and extended along the first direction X and the second line connects the first line and the corresponding inner output pad and is extended along the second direction Y.

For example, as illustrated in FIG. 9A, the inner output pads FOPI may include a first inner output pad P1, a second inner output pad P2 and a third inner output pad P3, which are adjacent along the first direction X. The landing vias LV may include a first landing via LV1, a second landing via LV2 and a third landing via LV3 corresponding to the first, second and third inner output pads P1, P2 and P3, respectively. The second and third landing vias LV2 and LV3 connected to the adjacent second and third inner output pads P2 and P3 may be adjacent and arranged along the first direction X. Among the inner connection lines TPL connected to the second and third landing vias LV2 and LV3, the inner connection line LX3 and LY3 connected to the third landing via LV3 may include a first line LX3 and a second line LY3. The first line LX3 may be connected to the corresponding top landing via pad, that is, the third landing via VL3, and may be extended along the first direction X. The second line LY3 may be connects the first line LX3 and the corresponding inner output pad, that is, the third inner output pad P3, and may be extended along the second direction Y. In contrast, the first line extended along the first direction X may be omitted with respect to the first and second top landing via pads of the first and second landing vias LV1 and LV2, and the first and second top landing via pads may be connected to the corresponding inner output pads P1 and P2 through the second lines LY1 and LY2, respectively. As illustrated in FIGS. 5 and 6, a plurality of landing vias LV may be adjacent and arranged along the first direction X, and the adjacent landing vias LV may be respectively connected to the second lines LY extended along the second direction Y using the first lines LY extended along the first direction X.

The outer output conductive patterns FOPO and OLO may be formed on the top surface of the base film 112 and may be respectively connected to the chip outer output pads COPO formed on the bottom surface of the semiconductor chip 160 of FIG. 3. The outer output conductive patterns FOPO and OLO may include a plurality of top outer output pads FOPO and a plurality of outer output lead lines OLO. The top outer output pads FOPO may be arranged along the first direction X within the output pad region OPR. The outer output lead lines OLO may be respectively connected to the top outer output pads FOPO and may be extended along the second direction Y across the first long side LS1 of the chip mounting region CMR.

As illustrated in FIGS. 9A and 9B, the inner output lead lines OLI formed on the bottom surface of the base film 111 and the outer output lead lines OLO formed on the top surface of the base film 111 may be arranged alternatively one by one along the first direction X.

The top input conductive patterns TIL, TIVP and FIP may be formed on the top surface of the base film 112 and may be respectively connected to chip input pads CIP formed on the bottom surface of the semiconductor chip 160 of FIG. 3. The top input conductive patterns TIL, TIVP and HP may include a plurality of top input pads FIP, a plurality of top input via pads TIVP and a plurality of top input lead lines TIL. The top input pads FIP may be arranged along the first direction X within the input pad region IPR. The top input lead lines TIL may be respectively connected to the top input pads FIP and the top input via pads TIVP and may be extended along the second direction Y across the second long side LS2 of the chip mounting region CMR. The top input via pads may be arranged on the input vias IV along the first direction X.

The bottom input conductive patterns BIVP and BIL may be formed on the bottom surface of the base film 112. The bottom input conductive patterns BIVP and BIL may include a plurality of bottom input via pads BIVP and a plurality of bottom input lead lines BIL. The bottom input via pads BIVP may be arranged beneath the input vias IV along the first direction X. The bottom input lead lines BIL may be respectively connected to the bottom input via pads BIVP and may be extended along the second direction Y.

The input vias IV may be formed to vertically penetrate the base film 112 and to respectively connect the top input via pads TIVP of the top input conductive patterns and the bottom input via pads BIVP of the bottom input. As illustrated in FIGS. 9A and 9B, the input vias IV may be arranged along the first direction X.

As illustrated in FIG. 9C, the COF package 102 may further include an underfill portion 170, a protection layer 180 and an adhesive layer 190.

The underfill portion 170 may cover the side portion of the semiconductor chip 160 that is mounted on the top surface of the base film 112. The underfill portion 170 may be implemented with resin to fill the space between the bottom surface of the semiconductor chip 160 and the top surface of the base film 112. The semiconductor chip 160 may be mounted and fixed on the top surface of the base film 112 by the underfill portion 170. In addition, connections between bumps of the semiconductor chip 160 and the pads FOPO, FOPI and FIP on the top surface of the base film 112 may be protected by the underfill portion 170.

The protection layer 180 may be formed on the top and bottom surfaces of the base film 112, respectively. The protection layer 180 may be implemented with solder resist or other materials. For example, as illustrated in FIG. 9C, the protection layer 180 may be formed on the top and bottom surface to expose output terminals OTO and OTI, input terminals IT and the semiconductor chip 160. In comparison with the input terminal IT of FIG. 8C that is exposed to face upwards, the input IT of FIG. 9C is exposed to face downwards. The output terminals OTO and OTI may be connected to terminals of the display panel 200 of FIG. 1 to transfer signals from the semiconductor chip 160 to the display panel 200. The input terminals IT may be connected to terminals of the PCB 300 of FIG. 1 to transfer signals from an external device to the semiconductor chip 160. Adhesive films may be deposited between the input and output terminals OTO, OTI and IT of the COF package 102 and the terminals of the other devices. The adhesive film may be an anisotropic conducting film (ACF).

The adhesive layer 190 may be formed between the surface portions facing each other in the bending region BNR. The bent shape may be maintained through the adhesive layer 190. The adhesive layer 190 may include non-conductive adhesive materials.

In some example embodiments, the base film 112 may be implemented as a resin film including polyimide, polyester, etc. The base film 112 may have flexibility to form the bending region BNR. The conductive patterns OLO, TPL, IL, OLI, FOPO, FOPI, FIP, TVP and BVP and/or the landing vias LV may be implemented with metals such as copper Cu, nickel Ni, aluminum Al, etc.

Figure 10:
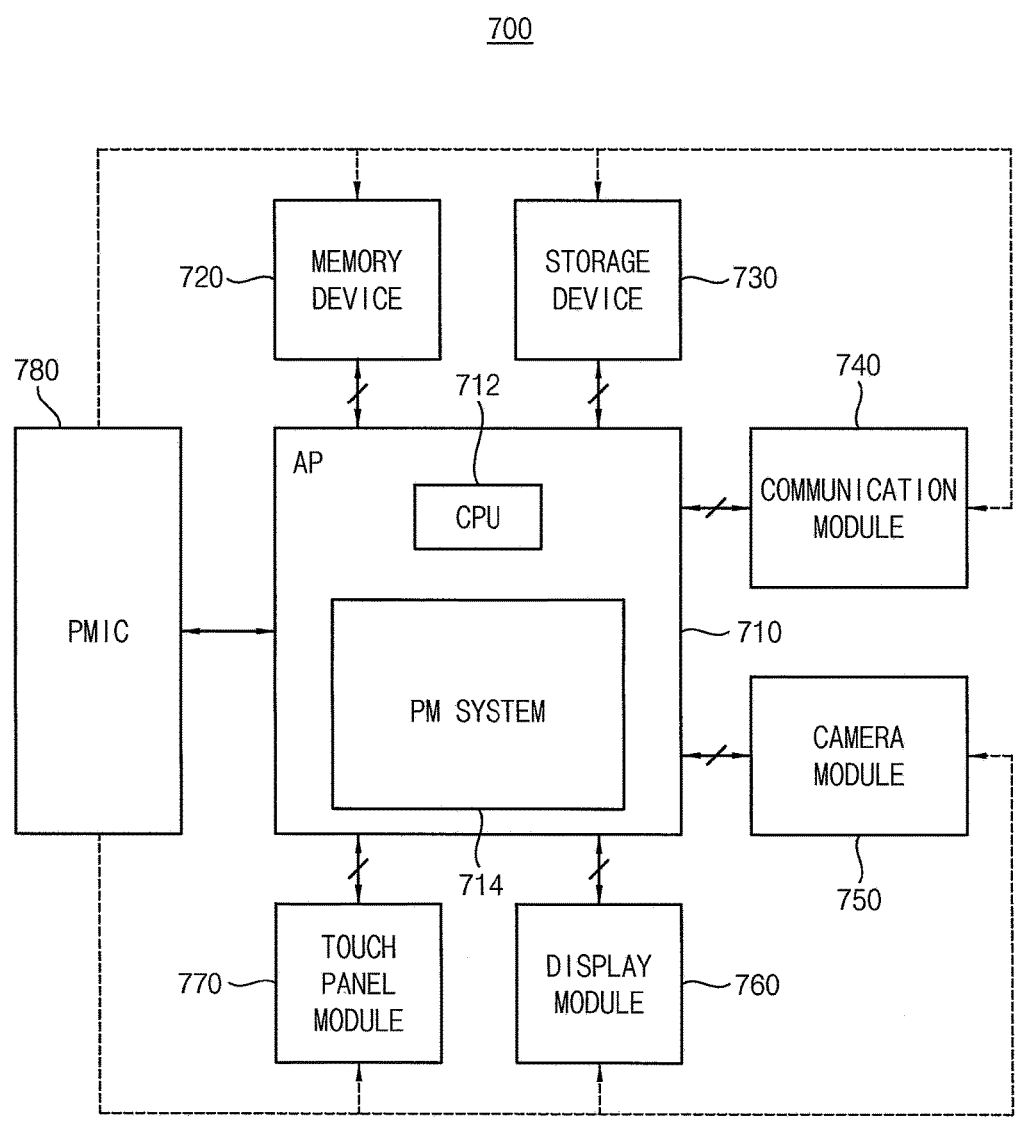
FIG. 10 is a block diagram illustrating a mobile device according to example embodiments.

FIG. 10 is a block diagram illustrating a mobile device according to example embodiments.

Referring to FIG. 10, a mobile device 700 includes a system on chip 710 and a plurality of functional modules 740, 750, 760, and 770. The mobile device 700 may further include a memory device 720, a storage device 730, and a power management integrated circuit (PMIC) 780.

The system on chip 710 controls overall operations of the mobile device 700. The system on chip 710 may control the memory device 720, the storage device 730, and the functional modules 740, 750, 760, and 770. For example, the system on chip 710 may be an application processor (AP). The system on chip 710 may include a CPU core 711 and a power management (PM) system 714.

The memory device 720 and the storage device 730 may store data for operations of the mobile device 700. The memory device 720 may correspond to a volatile semiconductor memory device such as a dynamic random access memory (DRAM) device, a static random access memory (SRAM) device, a mobile DRAM, etc. In addition, the storage device 730 may correspond to a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. In some embodiments, the storage device 730 may correspond to a solid state drive (SSD) device, a hard disk drive (HDD) device, a CD-ROM device, etc.

The functional modules 740, 750, 760, and 770 perform various functions of the mobile device 700. For example, the mobile device 700 may comprise a communication module 740 that performs a communication function (e.g., a code division multiple access (CDMA) module, a long term evolution (LTE) module, a radio frequency (RF) module, an ultra-wideband (UWB) module, a wireless local area network (WLAN) module, a worldwide interoperability for a microwave access (WIMAX) module, etc.), a camera module 750 that performs a camera function, a display module 760 that performs a display function, a touch panel module 770 that performs a touch sensing function, etc. In some embodiments, the mobile device 700 further includes a global positioning system (GPS) module, a microphone (MIC) module, a speaker module, a gyroscope module, etc. However, a kind of the functional modules 740, 750, 760, and 770 in the mobile device 700 is not limited thereto.

The PMIC 780 may provide driving voltages to the system on chip 710, the memory device 720 and the functional modules 740, 750, 760760, and 770, respectively.

According to example embodiments, the display module 760 includes a COF package and a display panel. As described above, the COF package according to example embodiments may reduce the size of the COF package by arranging the landing vias in a two-dimensional shape and thus enhance productivity of devices and systems including the COF package.

Figure 11:
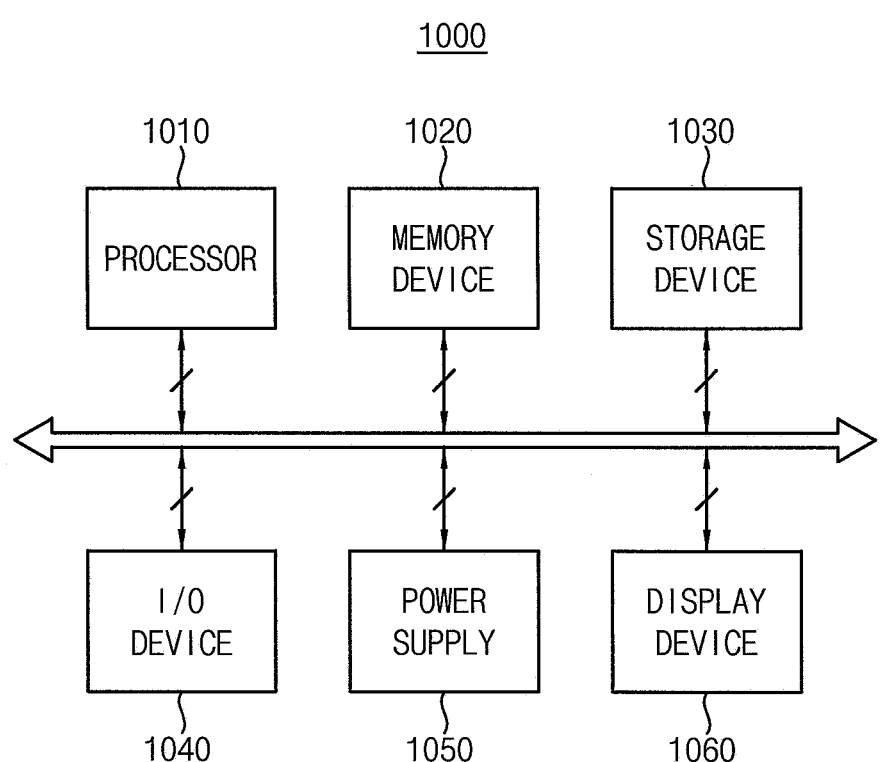
FIG. 11 is a block diagram illustrating an electronic device according to example embodiments.

FIG. 11 is a block diagram illustrating an electronic device according to example embodiments.

Referring to FIG. 11, an electronic device 1000 includes a processor 1010, a memory device 1020, a storage device 1030, an input/output (I/O) device 1040, a power supply 1050, and a display device 1060. In addition, the electronic device 1000 may include a plurality of ports for communicating a video card, a sound card, a memory card, a universal serial bus (USB) device, other electronic devices, etc.

The processor 1010 may perform various computing functions. The processor 1010 may be a microprocessor, a central processing unit (CPU), etc. The processor 1010 may be coupled to other components via an address bus, a control bus, a data bus, etc. Further, the processor 1010 may be coupled to an extended bus, such as a peripheral component interconnection (PCI) bus.

The memory device 1020 may store data for operations of the electronic device 1000. For example, the memory device 1020 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile dynamic random access memory (mobile DRAM) device, etc. The storage device 1030 may be a solid state drive (SSD) device, a hard disk drive (HDD) device, a CD-ROM device, etc.

The I/O device 1040 may be an input device such as a keyboard, a keypad, a mouse, a touchpad, a touch-screen, a remote controller, etc., and an output device such as a printer, a speaker, etc. In some example embodiments, the display device 1060 may be included in the I/O device 1040. The power supply 1050 may provide a power for operations of the electronic device 1000. The display device 1060 may communicate with other components via the buses or other communication links.

As described above, the display device 1060 includes a COF package and a display panel. The COF package according to example embodiments may reduce the size of the COF package by arranging the landing vias in a two-dimensional shape and thus enhance productivity of devices and systems including the COF package.

The electronic device 1000 may be any device including a display device. For example, the electronic device 1000 may be a television, a computer monitor, a laptop, a digital camera, a cellular phone, a smart phone, a personal digital assistant (PDA), a portable multimedia player (PMP), an MP3 player, a navigation system, or a video phone.

Figure 12:
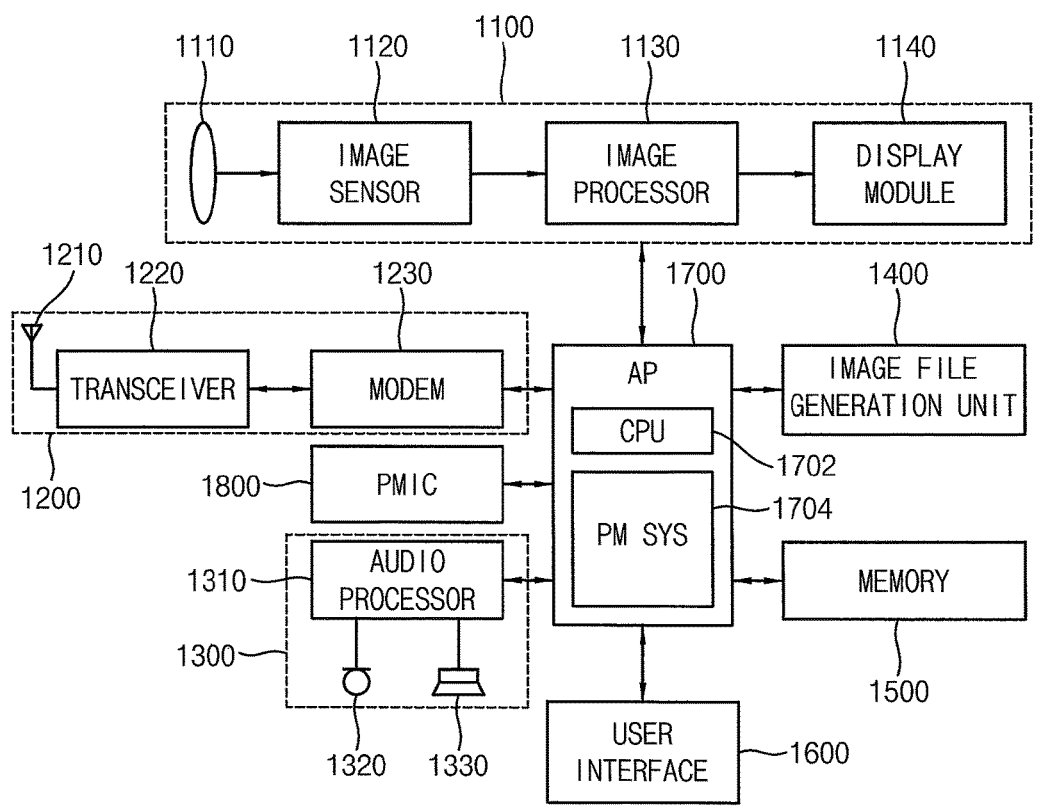
FIG. 12 is a block diagram illustrating a portable terminal according to example embodiments.

FIG. 12 is a block diagram illustrating a portable terminal according to example embodiments.

Referring to FIG. 12, a portable terminal 2000 includes an image processing block 1100, a wireless transceiving block 1200, an audio processing block 1300, an image file generation unit 1400, a memory device 1500, a user interface 1600, an application processor 1700, and a power management integrated circuit (PMIC) 1800.

The image processing block 1100 includes a lens 1110, an image sensor 1120, an image processor 1130, and a display module 1140. The wireless transceiving block 1200 includes an antenna 1210, a transceiver 1220 and a modem 1230. The audio processing block 1300 includes an audio processor 1310, a microphone 1320 and a speaker 1330.

As described above, the display module 1140 includes a COF package and a display panel. The COF package according to example embodiments may reduce the size of the COF package by arranging the landing vias in a two-dimensional shape and thus enhance productivity of devices and systems including the COF package.

The portable terminal 2000 may include various kinds of semiconductor devices. For example, the application processor 1700 may have low power consumption and high performance. The application processor 1700 may have multiple cores. In some embodiments, the application processor 1700 may include a CPU core 1702 and a power management (PM) system 1704.

The PMIC 1800 may provide driving voltages to the image processing block 1100, the wireless transceiving block 1200, the audio processing block 1300, the image file generation unit 1400, the memory device 1500, the user interface 1600 and the application processor 1700, respectively.

As such, the COF package according to example embodiments may reduce the size of the COF package by arranging the landing vias in a two-dimensional shape and thus enhance productivity of devices and systems including the COF package.

The above described embodiments may be applied to various kinds of devices and systems such as mobile phones, smartphones, tablet computers, laptop computers, personal digital assistants (PDAs), portable multimedia players (PMPs), digital televisions, digital cameras, portable game consoles, music players, camcorders, video players, navigation systems, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A chip-on-film (COF) package comprising:
    a base film including a chip mounting region and an output lead region adjacent to the chip mounting region;
    a semiconductor chip mounted on a top surface of the base film,
    the semiconductor chip being disposed within the chip mounting region of the base film;

a plurality of top inner output conductive patterns formed on the top surface of the base film and respectively connected to chip inner output pads formed on a bottom surface of the semiconductor chip;
a plurality of bottom inner output conductive patterns formed on a bottom surface of the base film, wherein the plurality of bottom inner output conductive patterns is extended from the chip mounting region to the output lead region; and
a plurality of landing vias formed to penetrate the base film and to respectively connect the top inner output conductive patterns and the bottom inner output conductive patterns,
the landing vias arranged within the chip mounting region to form a two-dimensional shape.

2. The COF package of claim 1,
wherein the landing vias are arranged to form at least one triangular shape.

3. The COF package of claim 1,
wherein the chip mounting region has a rectangular shape with first and second long sides along a first direction and first and second short sides along a second direction perpendicular to the first direction, and
the chip mounting region includes an output pad region adjacent to the first long side, an input pad region adjacent to the second long side and a landing via region between the output pad region and the input pad region.

4. The COF package of claim 3,
wherein the landing via region includes a plurality of sub-regions arranged along the first direction, and the sub-regions have a same arrangement of the landing vias.

5. The COF package of claim 3,
wherein the landing via region includes a plurality of sub-regions arranged along the first direction, and two adjacent sub-regions have a symmetric arrangement of the landing vias with respect to a boundary line of the two adjacent sub-regions.

6. The COF package of claim 3,
wherein the top inner output conductive patterns include:
a plurality of inner output pads arranged along the first direction within the output pad region;
a plurality of top landing via pads arranged on the landing vias within the landing via region; and
a plurality of inner connection lines respectively connecting the inner output pads and the top landing via pads.

7. The COF package of claim 6,
wherein at least two landing vias connected to at least two adjacent inner output pads are adjacent and arranged along the first direction.

8. The COF package of claim 7,
wherein at least one inner connection line among the inner connection lines connected to the at least two landing vias includes a first line and a second line, the first line connected to a corresponding top landing via pad and extended along the first direction, the second line connecting the first line and a corresponding inner output pad and extended along the second direction.

9. The COF package of claim 3,
wherein the bottom inner output conductive patterns include:
a plurality of bottom landing via pads arranged beneath the landing vias within the landing via region; and
a plurality of inner output lead lines respectively connected to the bottom landing via pads and extended along the second direction across the first long side of the chip mounting region.

10. The COF package of claim 3, further comprising:
a plurality of outer output conductive patterns formed on the top surface of the base film and respectively connected to chip outer output pads formed on the bottom surface of the semiconductor chip,
wherein the outer output conductive patterns include:
a plurality of top outer output pads arranged along the first direction within the output pad region; and
a plurality of outer output lead lines respectively connected to the top outer output pads and extended along the second direction across the first long side of the chip mounting region,
wherein the bottom inner output conductive patterns include a plurality of inner output lead lines formed on the bottom surface of the base film and extended along the second direction across the first long side of the chip mounting region,
wherein the outer output conductive patterns include the outer output lead lines formed on the top surface of the base film and extended along the second direction across the first long side of the chip mounting region, and
wherein the inner output lead lines and the outer output lead lines are arranged alternatively one by one along the first direction.

11. The COF package of claim 3, further comprising:
a plurality of top input conductive patterns formed on the top surface of the base film and respectively connected to chip input pads formed on the bottom surface of the semiconductor chip;
wherein the top input conductive patterns include:
a plurality of top input pads arranged along the first direction within the input pad region; and
a plurality of top input lead lines respectively connected to the top input pads and extended along the second direction across the second long side of the chip mounting region.

12. The COF package of claim 11, further comprising:
a plurality of bottom input conductive patterns formed on the bottom surface of the base film; and
a plurality of input vias formed to penetrate the base film and to connect the top input conductive patterns and the bottom input conductive patterns, respectively,
wherein the input vias are arranged along the first direction.

13. The COF package of claim 12,
wherein the bottom input conductive patterns include:
a plurality of bottom input via pads arranged beneath the input vias; and
a plurality of bottom input lead lines respectively connected to the bottom input via pads and extended along the second direction.

14. The COF package of claim 1,
wherein the base film includes a bending region corresponding to an end portion of the base film that is bent such that the bottom surface of the bending region faces upwards.

15. A display device comprising:
a display panel; and
a chip-on-film (COF) package configured to drive the display panel, the COF package comprising:
a base film;

a display driver chip mounted on a chip mounting region of a top surface of the base film;

a plurality of top inner output conductive patterns formed on the top surface of the base film and respectively connected to chip inner output pads formed on a bottom surface of the display driver chip;

a plurality of bottom inner output conductive patterns formed on a bottom surface of the base film and connected to the display panel; and a plurality of landing vias formed to vertically penetrate the base film and to respectively connect the top inner output conductive patterns and the bottom inner output conductive patterns, the landing vias arranged within the chip mounting region to form a two-dimensional shape, wherein the base film includes a bending region corresponding to an end portion of the base film that is bent such that the bottom surface of the bending region faces upwards.

16. The display device of claim 15, wherein the COF package further includes:

a plurality of outer output conductive patterns formed on the top surface of the base film and respectively connected to chip outer output pads formed on the bottom surface of the display driver chip; and a plurality of top input conductive patterns formed on the top surface of the base film and respectively connected to chip input pads formed on the bottom surface of the display driver chip.

17. A chip-on-film (COF) package comprising:

a base film including a chip mounting region and an output lead region adjacent to the chip mounting region;

a semiconductor chip mounted on a top surface of the base film, the semiconductor chip being disposed within a chip mounting region of the base film;

a plurality of top inner output conductive patterns formed on the top surface of the base film and respectively connected to chip inner output pads formed on a bottom surface of the semiconductor chip;

a plurality of bottom inner output conductive patterns formed on a bottom surface of the base film, wherein the plurality of bottom inner output conductive patterns is extended from the chip mounting region to the output lead region; and a plurality of landing vias formed to penetrate the base film and to connect the top inner output conductive patterns and the bottom inner output conductive patterns, respectively, the plurality of landing vias arranged in a plurality of rows substantially parallel with each other within the chip mounting region.

18. The COF package of claim 17, wherein the chip mounting region has a substantially rectangular shape with first and second long sides along a first direction and first and second short sides along a second direction substantially perpendicular to the first direction, wherein the chip mounting region includes an output pad region adjacent to the first long side, an input pad region adjacent to the second long side and a landing via region between the output pad region and the input pad region; and wherein the top inner output conductive patterns include:
  a plurality of inner output pads arranged along the first direction within the output pad region;
  a plurality of top landing via pads arranged on the landing vias within the landing via region; and
  a plurality of inner connection lines respectively connecting the inner output pads and the top landing via pads.

19. The COF package of claim 18, wherein the plurality of rows of the landing vias are arranged along the first direction, and a number of the landing vias in a row adjacent to the input pad region is greater than or equal to a number of the landing vias in a row farther away from the input pad region.

20. The COF package of claim 18, wherein the plurality of rows of the landing vias are arranged substantially parallel to a line that forms an angle to the first and second long sides of the chip mounting region.

* * * * *